US008098045B2

(12) United States Patent
Okano

(10) Patent No.: US 8,098,045 B2
(45) Date of Patent: Jan. 17, 2012

(54) CONNECTOR DEVICE, METHOD OF MANUFACTURING THE SAME, AND BATTERY PACK USING THE SAME

(75) Inventor: Fumitaka Okano, Higashiosaka (JP)

(73) Assignees: SANYO Electric Co., Ltd., Moriguchi-shi (JP); Sanyo Tuner Industries Co., Ltd., Daito-shi (JP)

( * ) Notice: Subject to any disclaimer, the term of this patent is extended or adjusted under 35 U.S.C. 154(b) by 939 days.

(21) Appl. No.: 12/107,294

(22) Filed: Apr. 22, 2008

(65) Prior Publication Data

US 2008/0265837 A1  Oct. 30, 2008

(30) Foreign Application Priority Data

Apr. 27, 2007  (JP) ................................. 2007-118903

(51) Int. Cl.
*H02J 7/00* (2006.01)
*H01M 2/10* (2006.01)
(52) U.S. Cl. ......................... 320/110; 320/112; 429/100
(58) Field of Classification Search .................. 320/110, 320/107, 112, 113; 429/100, 96
See application file for complete search history.

(56) References Cited

U.S. PATENT DOCUMENTS

| 5,832,371 | A | * | 11/1998 | Thornton ................... 455/575.1 |
| 6,055,724 | A | | 5/2000 | Nishino et al. |
| 6,225,778 | B1 | * | 5/2001 | Hayama et al. ............... 320/112 |
| 6,656,627 | B2 | * | 12/2003 | Yokoyama et al. ........... 429/100 |
| 7,790,309 | B2 | * | 9/2010 | Okachi et al. ................. 429/129 |
| 7,858,221 | B2 | * | 12/2010 | Sato .............................. 429/121 |
| 2006/0285231 | A1 | * | 12/2006 | Kiyomura et al. ............ 359/797 |
| 2008/0152994 | A1 | | 6/2008 | Yamagami et al. |

FOREIGN PATENT DOCUMENTS

| CN | 101197433 A | 6/2008 |
| JP | 6-275335 A | 9/1994 |
| JP | 2000-69137 A | 3/2000 |

OTHER PUBLICATIONS

Korean Office Action dated Oct. 22, 2010, issued in corresponding Korean Pateant Application No. 10-2007-0135778.
Chinese Office Action dated Nov. 4, 2010, issued in corresponding Chinese Patent Application No. 200810003851.6.
Japanese Office Action dated Sep. 20, 2011, issued in corresponding Japanese Patent Application No. 2007-118903.

* cited by examiner

*Primary Examiner* — Hoai-An D Nguyen
(74) *Attorney, Agent, or Firm* — Westerman, Hattori, Daniels & Adrian, LLP

(57) ABSTRACT

A connector device includes a circuit board and a connector body, and the connector body includes a housing and a connection terminal provided inside the housing. A silicon resin is applied to fill a gap between the connector body and the circuit board. The application of the silicon resin can prevent a mold resin used to seal the connector device and a battery pack body from entering from the gap into the housing. Thereby, a connector device reliably establishing conduction and a battery pack applying such a connector device can be obtained.

10 Claims, 28 Drawing Sheets

CONNECTOR DEVICE, METHOD OF MANUFACTURING THE SAME, AND BATTERY PACK USING THE SAME

BACKGROUND OF THE INVENTION

1. Field of the Invention

The present invention relates to a connector device, a method of manufacturing the same, and a battery pack using the same. In particular, the present invention relates to a connector device finally sealed with a mold resin, a method of manufacturing such a connector device, and a battery pack applying such a connector device.

2. Description of the Background Art

Conventionally, for example, in order to connect a battery pack of a mobile phone to a body of the phone, a connector device is used in the battery pack. The connector device includes a prescribed circuit board and a connector body fixed to the circuit board. The connector device is integrated with a battery pack body. When a terminal of the phone body is inserted into the connector body, electric power in the battery pack is supplied to the mobile phone. As an example of such a connector device, there is a connector device sealed integrally with a battery pack body with a mold resin.

A method of manufacturing a connector device of this type will be described. Firstly, as shown in FIG. 28, a board 121 having a plurality of regions 121a each punched out into a prescribed shape and supposed to serve as a circuit board is prepared. A prescribed circuit pattern 122 is formed on each of the plurality of regions 121a. Circuit pattern 122 includes a land 123 to which a connector body is connected. A solder paste 124 is applied on circuit pattern 122. Subsequently, a prescribed electronic component 125 is placed based on circuit pattern 122, with solder paste 124 interposed therebetween.

Next, as shown in FIG. 29, a connector body 102 of the connector device is placed on each region 121a. A housing 103 of connector body 102 has a connection terminal 107 provided therein. Connection terminal 107 comes into contact with corresponding land 123. Housing 103 is also provided with a board end surface facing portion 104 facing an end surface 108a of a board portion of region 121a supposed to serve as a circuit board. When connector body 102 is placed on board 121, connector body 102 is placed on board 121 with board end surface facing portion 104 separated from end surface 108a by a prescribed distance, in consideration of variations in dimensions of board 121, a punched-out shape of board 121, and accuracy of placing connector body 102.

Next, as shown in FIG. 30, board 121 is carried in an inclined manner such that board end surface facing portion 104 is at a higher position, and introduced into a reflow furnace (not shown). Board 121 introduced into the reflow furnace is subjected to heat treatment at a prescribed temperature, and thereby solder paste 124 is melted. As a result, connector body 102 inclined with respect to a horizontal direction slides, board end surface facing portion 104 approaches end surface 108a, and thus connector body 102 is aligned at a prescribed position on board 121 in a manner self aligning with board 121. Subsequently, solder paste 124 is cooled down, and connector body 102 and prescribed electronic component 125 are fixed on board 121.

Next, region 121a supposed to serve as a circuit board is removed from board 121, and thus a connector device 101 including a circuit board 108 and connector body 102 is completed, as shown in FIG. 31. Subsequently, as shown in FIG. 32, the completed connector device 101 and a battery pack body 115 are sealed with a mold resin 116.

Thereby, a battery pack 117 in which connector device 101 and battery pack body 115 are integrated by mold resin 116 is completed. A terminal of a phone body (not shown) is inserted into connection terminal 107 of connector body 102 exposed on the surface of battery pack 117, and supplied with electric power. Examples of documents disclosing a battery pack for a mobile phone or the like include Japanese Patent Laying-Open No. 2000-069137.

However, conventional connector device 101 has a problem as described below. Connector body 102 is fixed on circuit board 108 with solder (solder paste). Therefore, as shown in FIG. 33, a gap SH of around 0.1 mm, for example, may be generated between a lower portion of connector body 102 and a surface of circuit board 108, due to a thickness of the solder.

Further, there are variations in the accuracy of placing connector body 102 on board 121, the punched-out shape of board 121, the degree of sliding of connector body 102 during the reflow process, or the like. Therefore, as shown in FIG. 34, a gap SV of around 0.05 mm, for example, may be generated between board end surface facing portion 104 of connector body 102 and end surface 108a of circuit board 108.

As a result, as shown in FIGS. 35 and 36, when connector device 101 and battery pack body 115 are sealed with mold resin 116, mold resin 116 may enter into connector body 102 through such gaps (arrows 141, 142), and conduction between connection terminal 107 provided inside connector body 102 and the phone body (not shown) may fail to be established.

SUMMARY OF THE INVENTION

The present invention has been made to solve the aforementioned problem, and one object of the present invention is to provide a connector device reliably establishing conduction with main body equipment such as a mobile phone. Another object of the present invention is to provide a method of manufacturing such a connector device, and still another object of the present invention is provide a battery pack applying such a connector device.

A connector device in accordance with the present invention includes a circuit board, a connector body, and a sealing member. The connector body is attached to a main surface of the circuit board, and has a connection terminal electrically connected to a prescribed terminal on the circuit board and a housing holding and covering the connection terminal. The sealing member fills a gap between the housing and the circuit board.

According to this configuration, the gap between the housing and the circuit board is filled with the sealing member. Thereby, when the connector device is sealed with a mold resin, the mold resin is prevented from entering into the connector body. As a result, failure of conduction between the connection terminal provided inside the connector body and external equipment such as a mobile phone body can be prevented.

In order to align the connector device with the circuit board in a self-aligning manner, it is preferable to include a board end surface facing portion extending along an end surface of the circuit board and facing the end surface. In this case, it is preferable that the sealing member includes a portion filling a gap between the board end surface facing portion and the end surface.

Preferably, the housing includes a sealing member introducing portion extending toward a first side of the housing on which the board end surface facing portion is formed, from a second side opposite to the first side, and introducing the sealing member from the second side toward the first side.

Thereby, only by applying the sealing member from the second side, the gap can be filled in a single application step.

As a more specific structure of the connector body, it is preferable that the connection terminal is provided inside the housing in a plural number, the housing includes a partition plate separating and holding each connection terminal, and the sealing member introducing portion includes the partition plate and a concave portion provided adjacent to a lower end portion of a portion where the partition plate is connected to an outer wall of the housing on the second side.

More specifically, a silicon resin is preferable as the sealing member.

Further, in order to introduce the sealing member using a capillary phenomenon, it is preferable that the sealing member has a viscosity of 1.4 Pa·s to 2.5 Pa·s.

If the viscosity is greater than 2.5 Pa·s, it is not possible to introduce the sealing member into the gap using the capillary phenomenon, and the sealing member is too thick relative to the size of the circuit board. If the viscosity is less than 1.4 Pa·s, the sealing member has a weakened adhesive force (strength) and cannot prevent entrance of the mold resin.

A method of manufacturing a connector device in accordance with the present invention includes a fixing step fixing a connector body holding a connection terminal to a prescribed position on a circuit board such that the connection terminal is connected to a prescribed terminal on the circuit board, an application step applying a sealing member to fill a gap between the connector body and the circuit board, and a step of curing the applied sealing member.

According to this method, the sealing member is applied to fill the gap between the connector body and the circuit board, and then cured. Thereby, when the connector device is sealed with a mold resin, the mold resin is prevented from entering into the connector body. As a result, failure of conduction between the connection terminal provided inside the connector body and external equipment such as a mobile phone body can be prevented.

More specifically, in the application step applying the sealing member, it is preferable that the sealing member is introduced into the gap between the connector body and the circuit board by a capillary phenomenon.

Thereby, the gap can be reliably filled with the sealing member.

More specifically, it is preferable that the connector body includes a housing holding and covering the connection terminal and a board end surface facing portion provided to the housing and facing an end surface of the circuit board with the connector body attached to the circuit board, and the fixing step fixing the connector body to the circuit board includes the steps of applying solder to the circuit board, placing the connector body on the circuit board, melting the solder by performing heat treatment with the board inclined such that the board end surface facing portion approaches the end surface of the board, and cooling the melted solder and fastening the connector body to the circuit board.

When the board end surface facing portion is provided, it is preferable that the sealing member is introduced into a gap between the housing and the circuit board and a gap between the board end surface facing portion and the end surface of the board by a capillary phenomenon in the application step.

Preferably, the housing includes a sealing member introducing portion extending toward a first side of the housing on which the board end surface facing portion is formed, from a second side opposite to the first side, and introducing the sealing member from the second side toward the first side, and the sealing member is applied to a lower end portion of the housing on the second side and thereby introduced from the second side to the first side via the sealing member introducing portion by a capillary phenomenon in the application step.

Thereby, only by applying the sealing member from the second side, the gap can be filled in a single application step.

A battery pack in accordance with the present invention includes a circuit board, a connector body, a sealing member, a battery pack body, and a mold resin. The connector body is attached to a main surface of the circuit board, and has a connection terminal electrically connected to a prescribed terminal on the circuit board and a housing holding and covering the connection terminal. The sealing member fills a gap between the housing and the circuit board. The battery pack body is provided at a prescribed position with respect to the circuit board to which the connector body is attached. The mold resin seals the connector body, the circuit board, and the battery pack body such that the connection terminal of the connector body is exposed.

According to this configuration, the gap between the housing and the circuit board is filled with the sealing member. Thereby, when the connector body, the circuit board, and the battery pack body are sealed with the mold resin, the mold resin is prevented from entering into the connector body. As a result, failure of conduction between the connection terminal provided inside the connector body and external equipment such as a mobile phone body and interruption of electric power supply can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
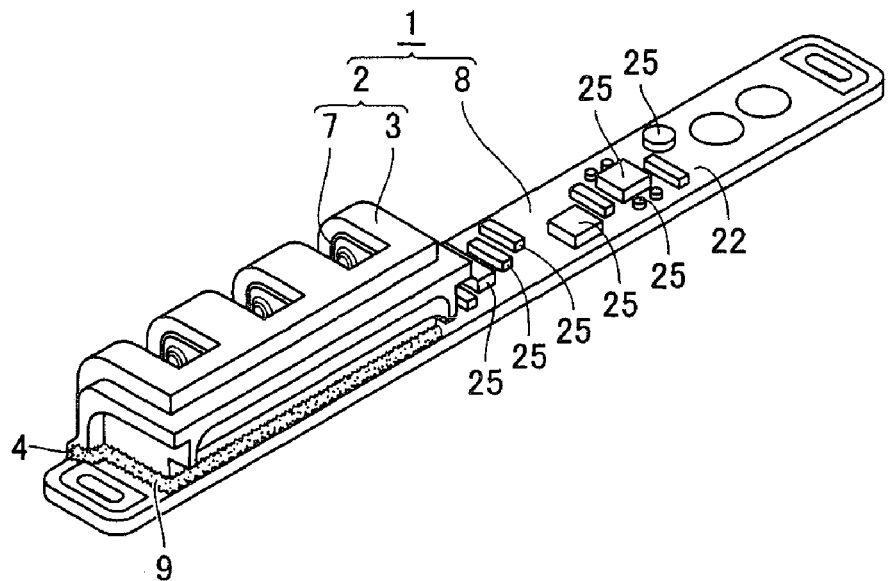
FIG. 1 is a first perspective view of a connector device in accordance with a first embodiment of the present invention.
Figure 2:
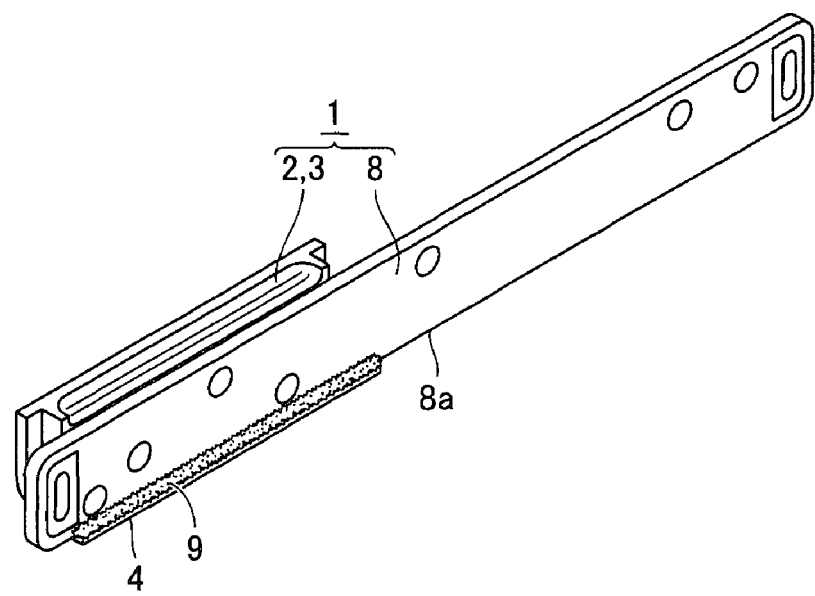
FIG. 2 is a second perspective view of the connector device in the same embodiment.

As a connector device in accordance with a first embodiment of the present invention, a connector device used in a battery pack of a mobile phone will be described. As shown in FIGS. 1 and 2, a connector device 1 includes a circuit board 8 and a connector body 2, and connector body 2 includes a housing 3 and a connection terminal 7 provided inside housing 3. Connection terminal 7 is connected to a land 23 (see FIG. 7) formed on circuit board 8.

Housing 3 is also provided with a board end surface facing portion 4 facing an end surface 8a of circuit board 8 to align connector body 2 with circuit board 8. A prescribed circuit pattern 22 is formed on a surface of circuit board 8, and a prescribed electronic component 25 is mounted based on circuit pattern 22.

In connector device 1, a silicon resin 9 is applied to fill a gap between connector body 2 and circuit board 8. As described later, when connector device 1 and a battery pack body are sealed with a mold resin, the application of silicon resin 9 into the gap between connector body 2 and circuit board 8 can prevent the mold resin from entering from the gap into connector body 2 and causing failure of conduction between the connection terminal provided inside and a body of the mobile phone.

Figure 3:
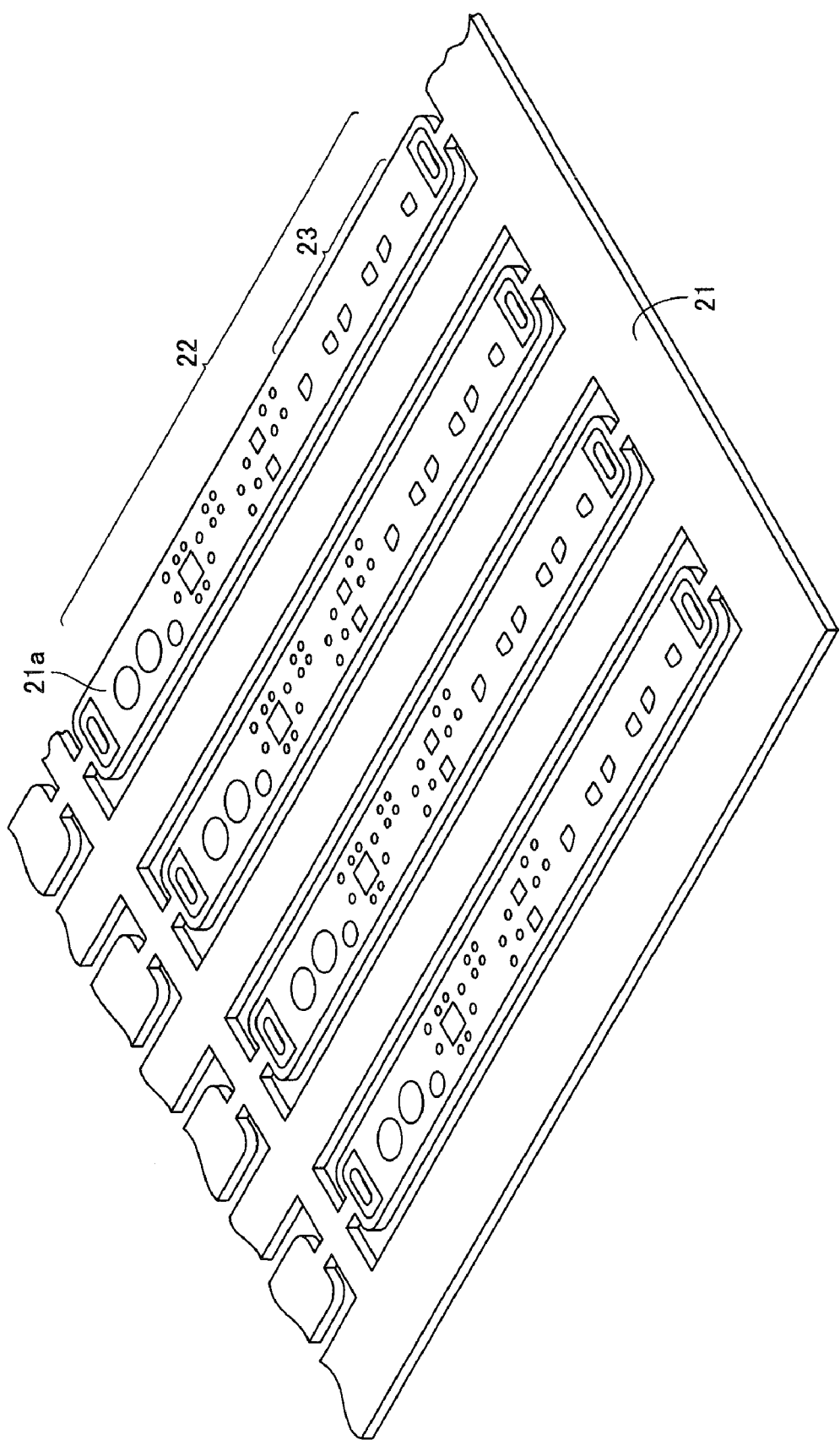
FIG. 3 is a partial perspective view showing a step of a method of manufacturing the connector device in the same embodiment.

Next, an exemplary method of manufacturing the connector device and a battery pack using the same will be described. Firstly, as shown in FIG. 3, a prescribed board 21 having a plurality of regions 21a each punched out into a prescribed shape and supposed to serve as a circuit board is prepared. Prescribed circuit pattern 22 is formed on each of the plurality of regions 21a. Circuit pattern 22 includes land 23 to which the connector body is connected. Each region 21a is to be finally removed from board 21, as a circuit board.

Figure 4:
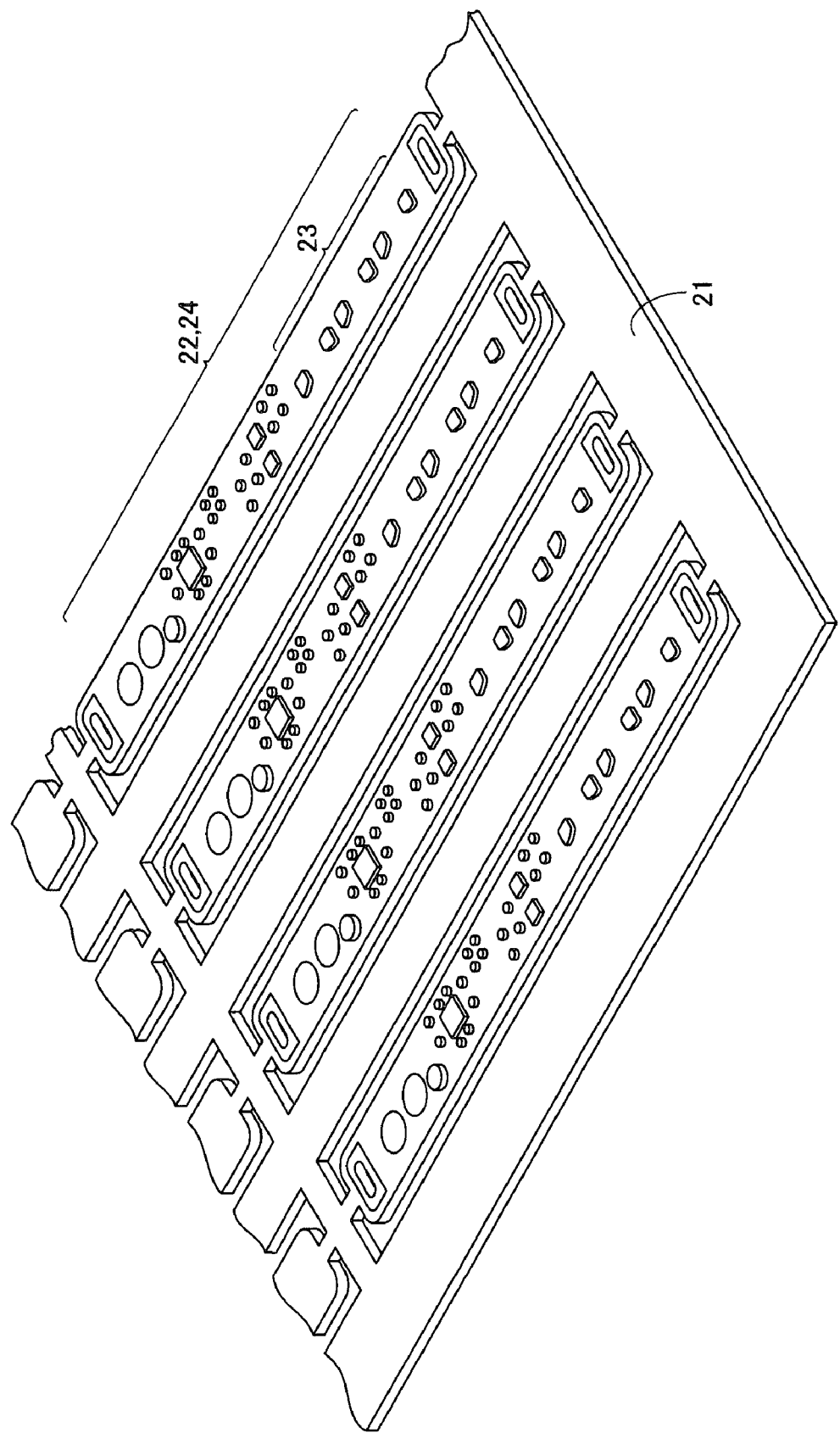
FIG. 4 is a partial perspective view showing a step performed after the step shown in FIG. 3 in the same embodiment.
Figure 5:
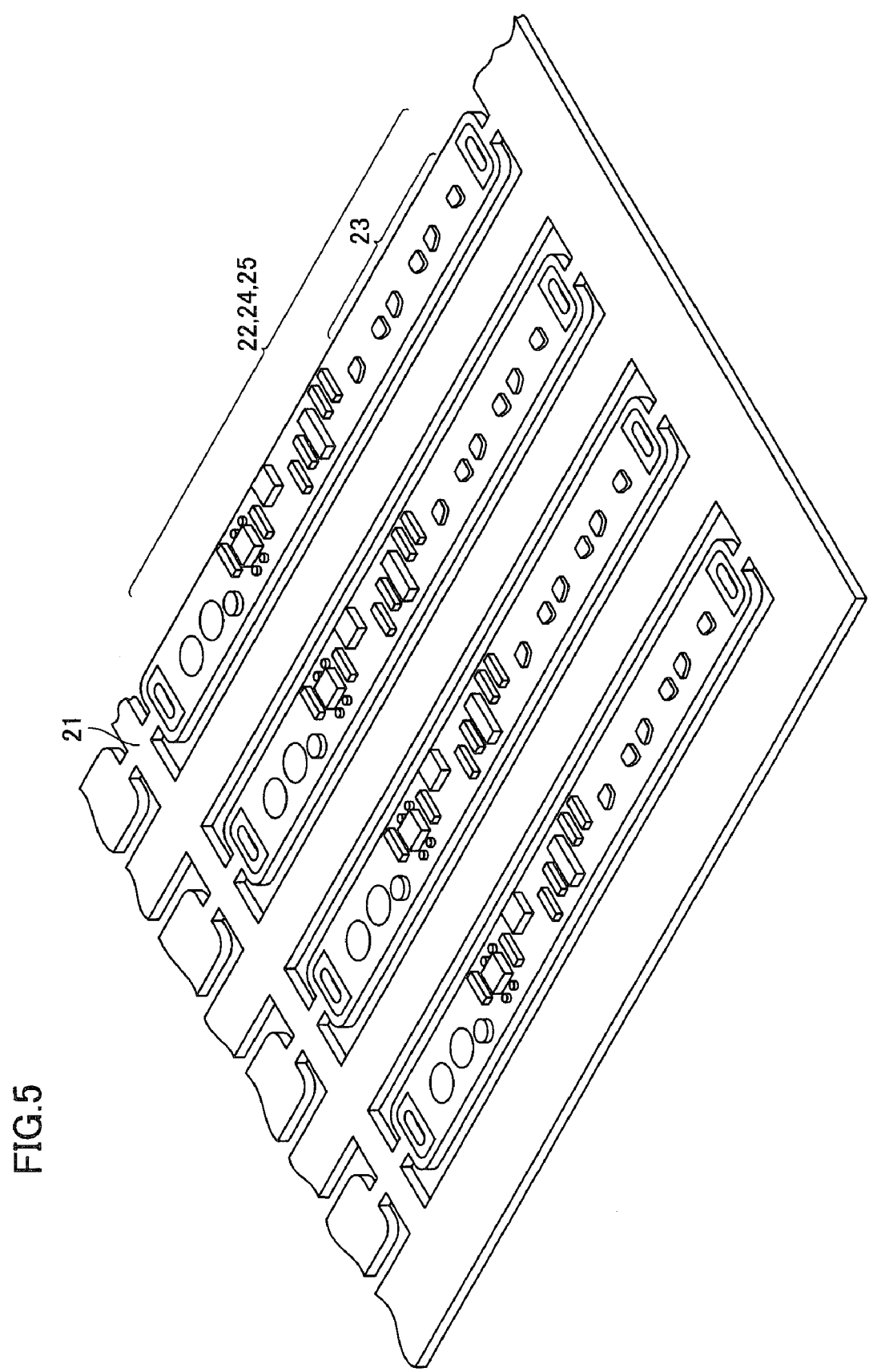
FIG. 5 is a partial perspective view showing a step performed after the step shown in FIG. 4 in the same embodiment.
Figure 6:
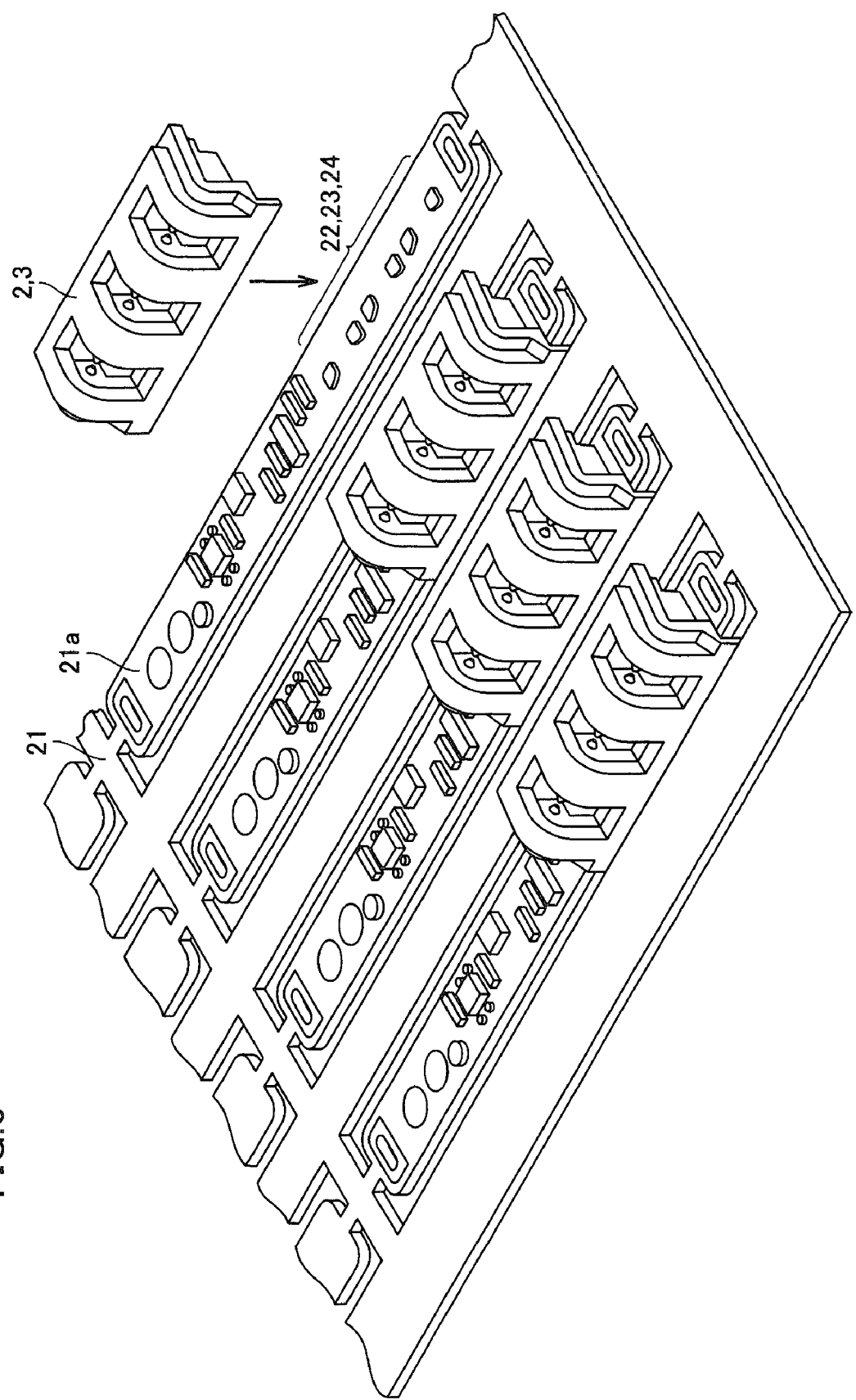
FIG. 6 is a partial perspective view showing a step performed after the step shown in FIG. 5 in the same embodiment.

Next, as shown in FIG. 4, a lead (Pb)-free solder paste 24 is applied on circuit pattern 22 of each region 21a, using a metal mask (not shown). Subsequently, as shown in FIG. 5, prescribed electronic component 25 is placed based on circuit pattern 22, with solder paste 24 interposed therebetween. Next, as shown in FIG. 6, connector body 2 is placed on each region 21a.

Figure 7:
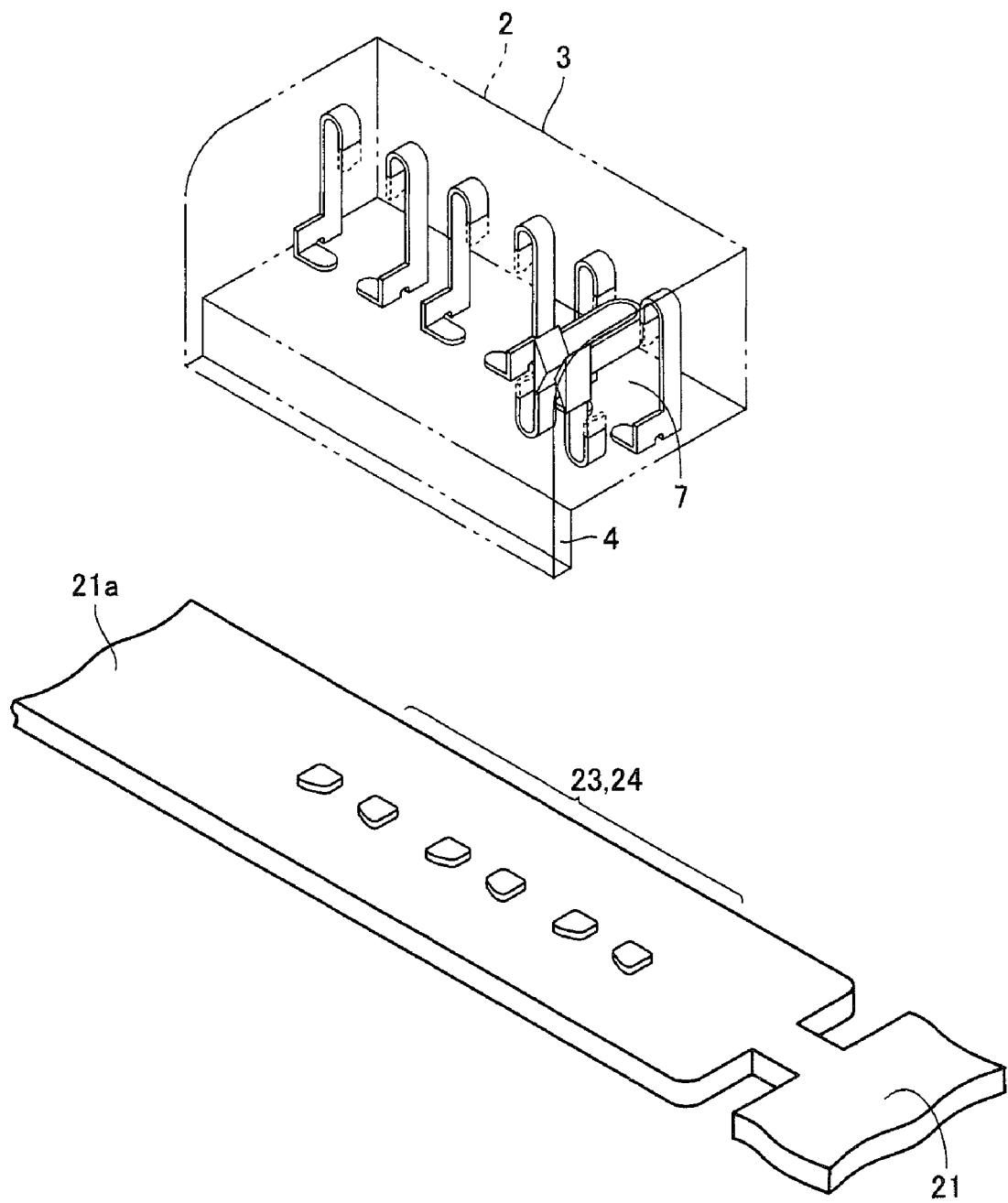
FIG. 7 is a partially enlarged perspective view in the step shown in FIG. 6 in the same embodiment.
Figure 8:
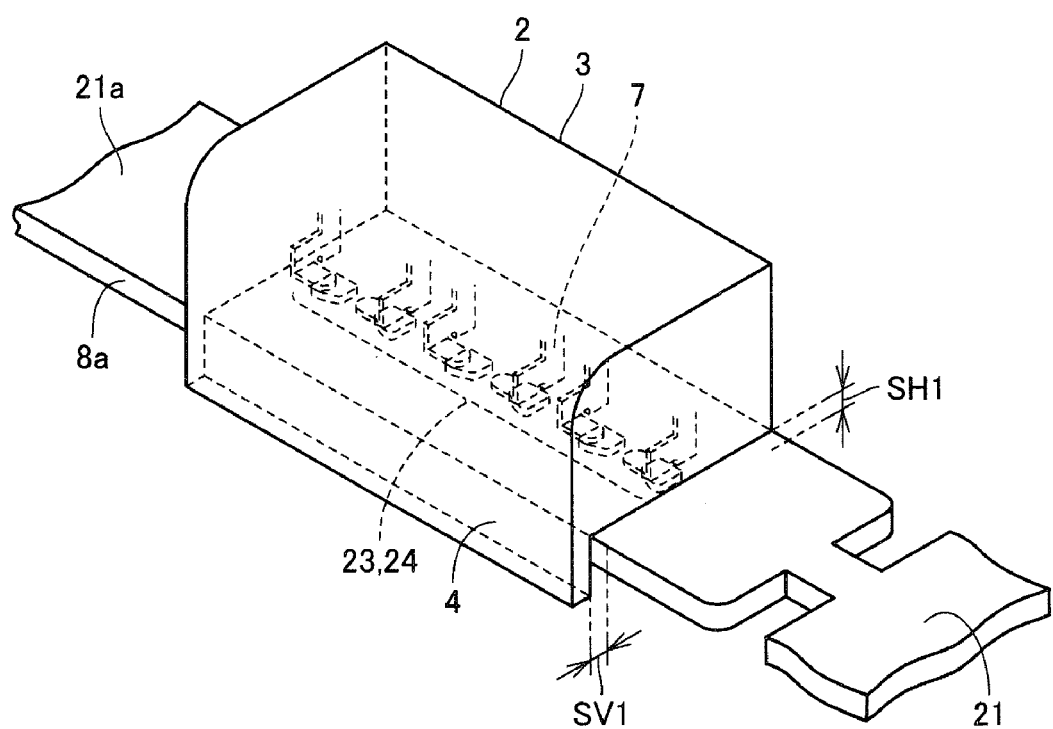
FIG. 8 is a partially enlarged perspective view showing a step performed after the step shown in FIG. 7 in the same embodiment.

On this occasion, as shown in FIGS. 7 and 8, a plurality of connection terminals 7 provided inside housing 3 of connector body 2 come into contact with corresponding lands 23. Further, connector body 2 is placed on region 21a with board end surface facing portion 4 of housing 3 separated from end surface 8a of region 21a by a prescribed distance, in consideration of variations in dimensions of board 21, a punched-out shape of board 21, and accuracy of placing connector body 2. Therefore, a gap SV1 is present between board end surface facing portion 4 and end surface 8a. Further, since connection terminal 7 comes into contact with land 23 with solder paste 24 interposed therebetween, a gap SH1 is present between a lower end portion of housing 3 and an upper surface of region 21a.

Figure 9:
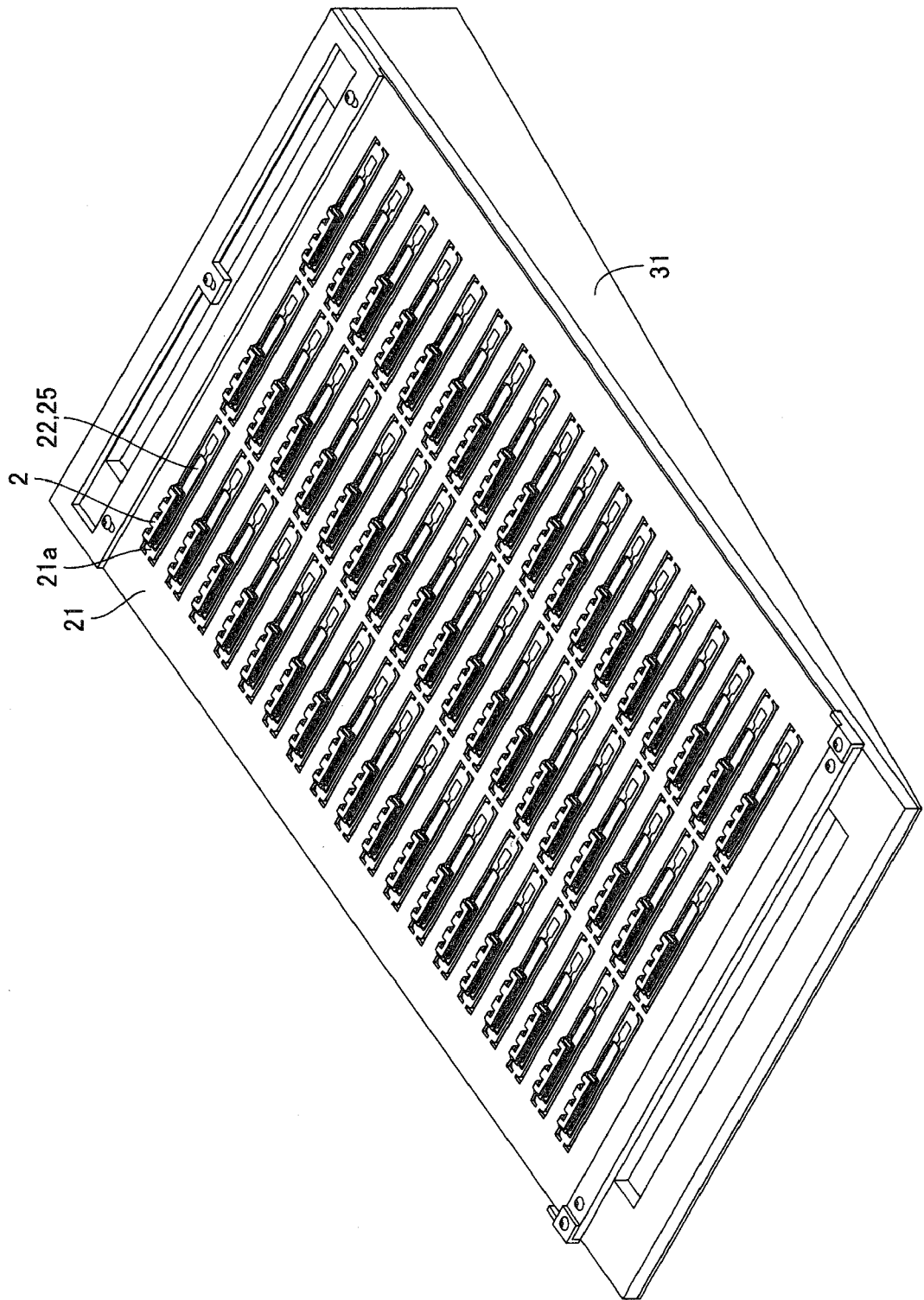
FIG. 9 is a perspective view showing a step performed after the step shown in FIG. 8 in the same embodiment.

Thereby, as shown in FIG. 9, board 21, in which connector body 2 and electronic component 25 are placed on each region 21a, is mounted to a jig 31 with a prescribed inclination such that the board end surface facing portion of connector body 2 is at a higher position. Board 21 mounted to jig 31 is carried with jig 31 and introduced into a reflow furnace (not shown). Board 21 introduced into the reflow furnace is subjected to heat treatment, for example at a temperature of about 230° C. to 250° C., and for about several tens of seconds.

Figure 10:
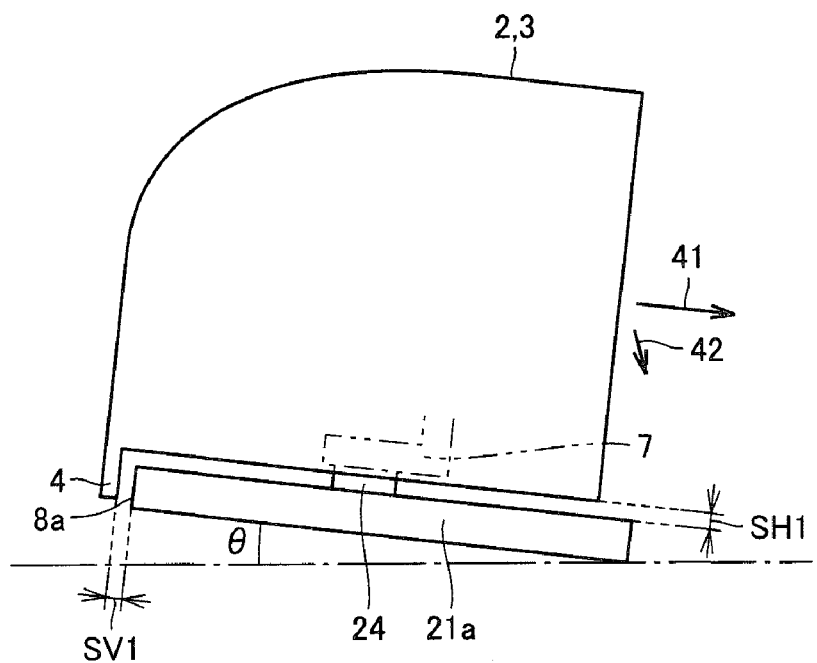
FIG. 10 is a first partial side view showing a behavior of a connector body in the step shown in FIG. 9 in the same embodiment.
Figure 11:
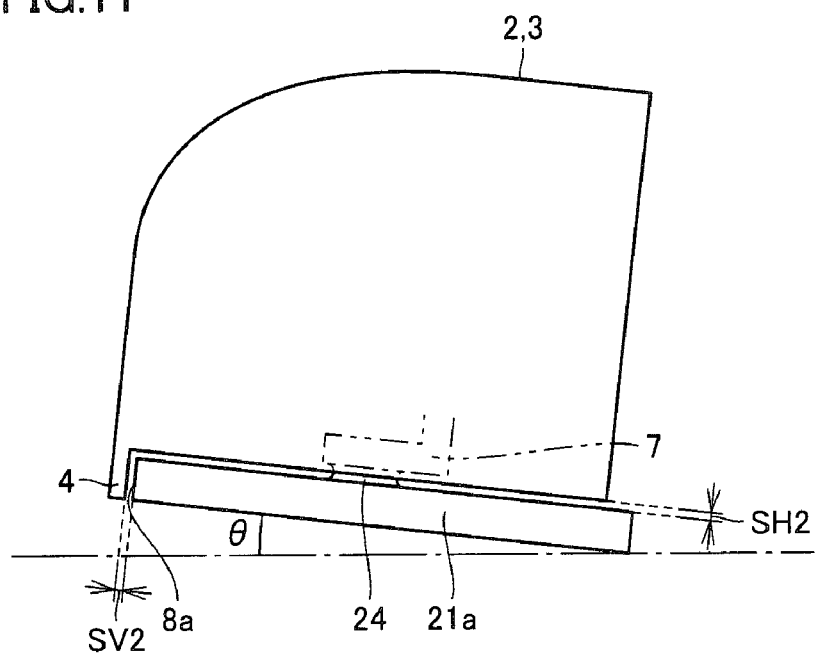
FIG. 11 is a second partial side view showing the behavior of the connector body in the step shown in FIG. 9 in the same embodiment.

As shown in FIGS. 10 and 11, solder paste 24 is melted by the heat treatment. As a result, connector body 2 inclined with respect to a horizontal direction (by an angle θ) slides (an arrow 41), and board end surface facing portion 4 approaches end surface 8a of region 21a. When board end surface facing portion 4 comes into contact with a portion of end surface 8a, connector body 2 does not slide any more, and is aligned at a prescribed position in a manner self aligning with region 21a.

On this occasion, a gap SV2 is still present between board end surface facing portion 4 and end surface 8a, depending on a position where connector body 2 is originally placed and a punched-out shape of region 21a. Further, since solder paste 24 is melted, solder flows and thus housing 3 moves downward (an arrow 42), reducing the gap between the lower end portion of housing 3 and region 21a. Nevertheless, a gap SH2 is still present between the lower end portion of housing 3 and region 21a, depending on an original thickness of solder paste 24 or the like.

Figure 12:
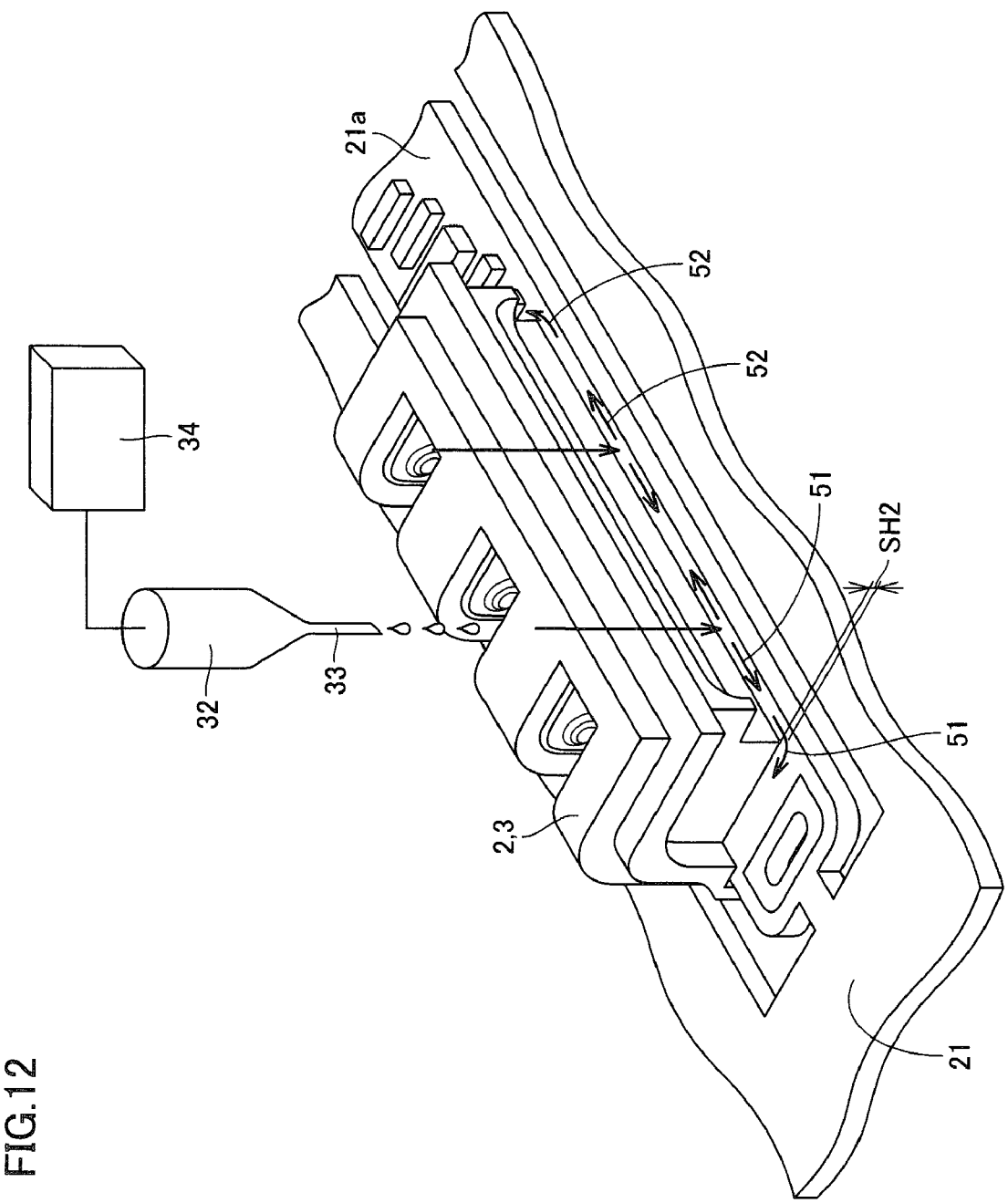
FIG. 12 is a partially enlarged perspective view showing a step performed after the step shown in FIG. 9 in the same embodiment.
Figure 13:
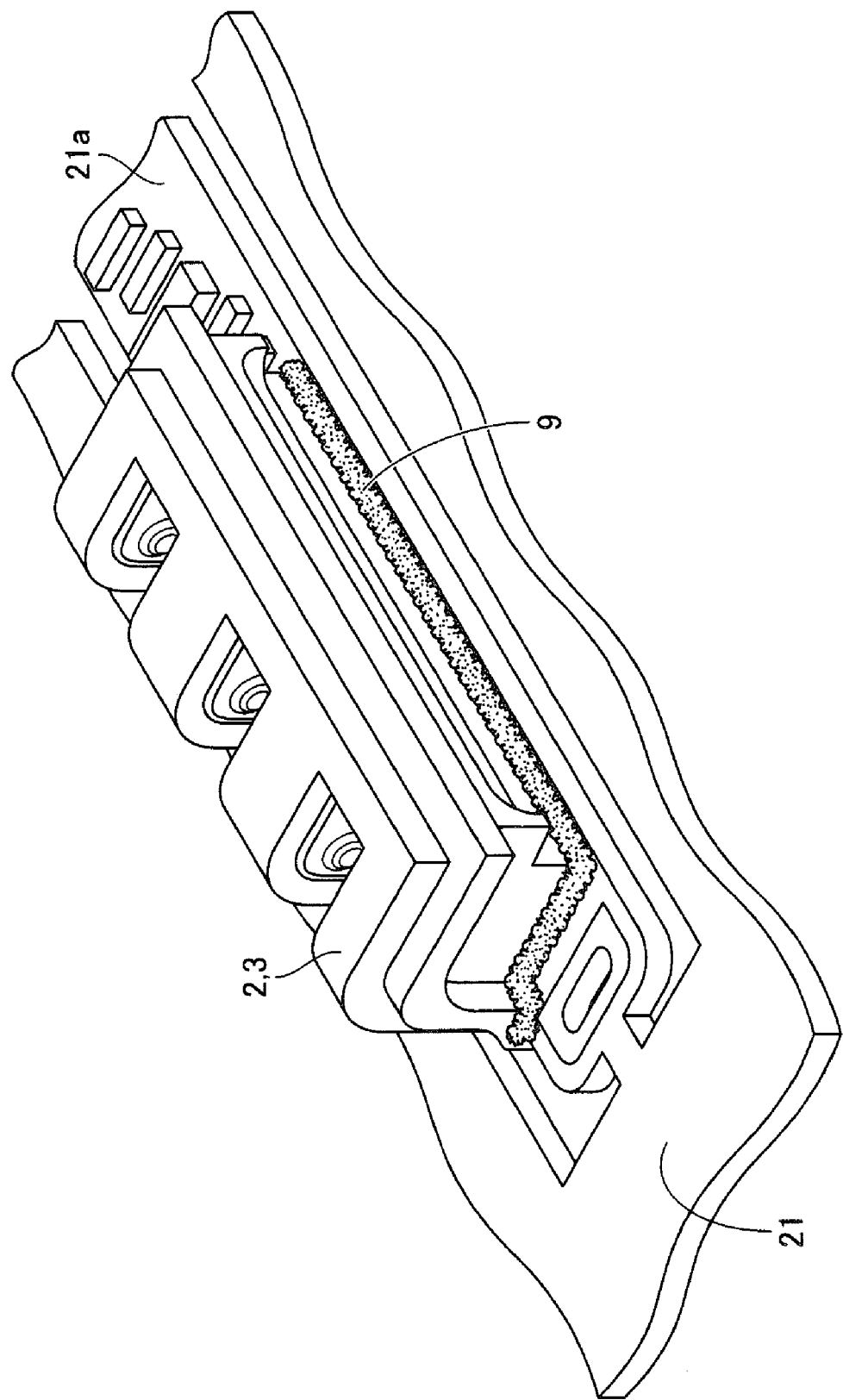
FIG. 13 is a partially enlarged perspective view showing a step performed after the step shown in FIG. 12 in the same embodiment.

Next, a treatment of filling such gaps SV2 and SH2 is performed. As shown in FIG. 12, a dispenser 34 and a syringe 32 are used to apply a silicon resin with a viscosity of 1.4 Pa·s to 2.5 Pa·s from a nozzle 33 of syringe 32 to a prescribed area in gap SH2 between the lower end portion of housing 3 and region 21a. The silicon resin applied in gap SH2 flows by a capillary phenomenon as indicated by arrows 51 and 52 to spread throughout gap SH2. Thereafter, as shown in FIG. 13, the silicon resin is dried at room temperature and cured, and thus gap SH2 is filled with silicon resin 9.

Figure 14:
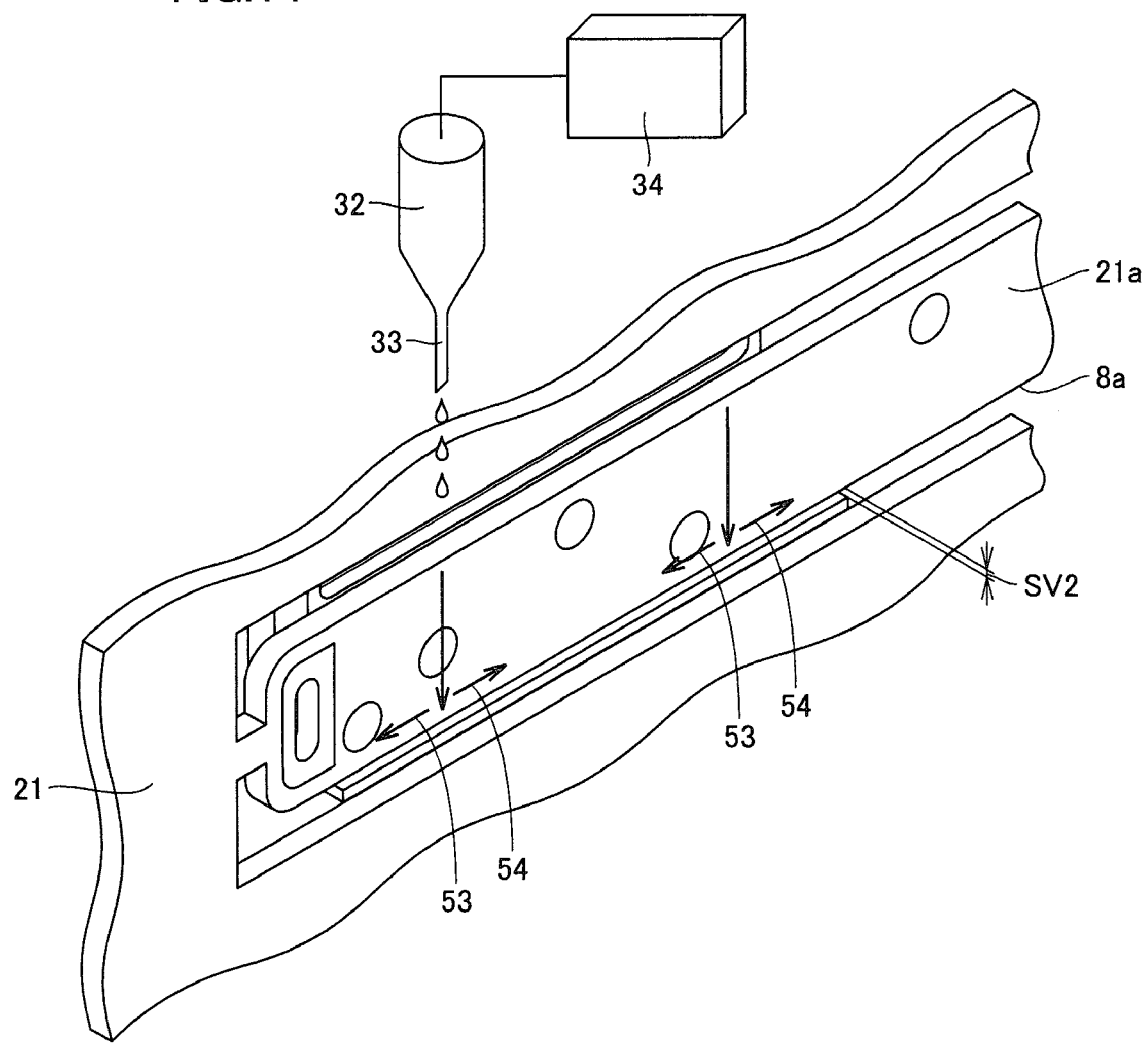
FIG. 14 is a partially enlarged perspective view showing a step performed after the step shown in FIG. 13 in the same embodiment.
Figure 15:
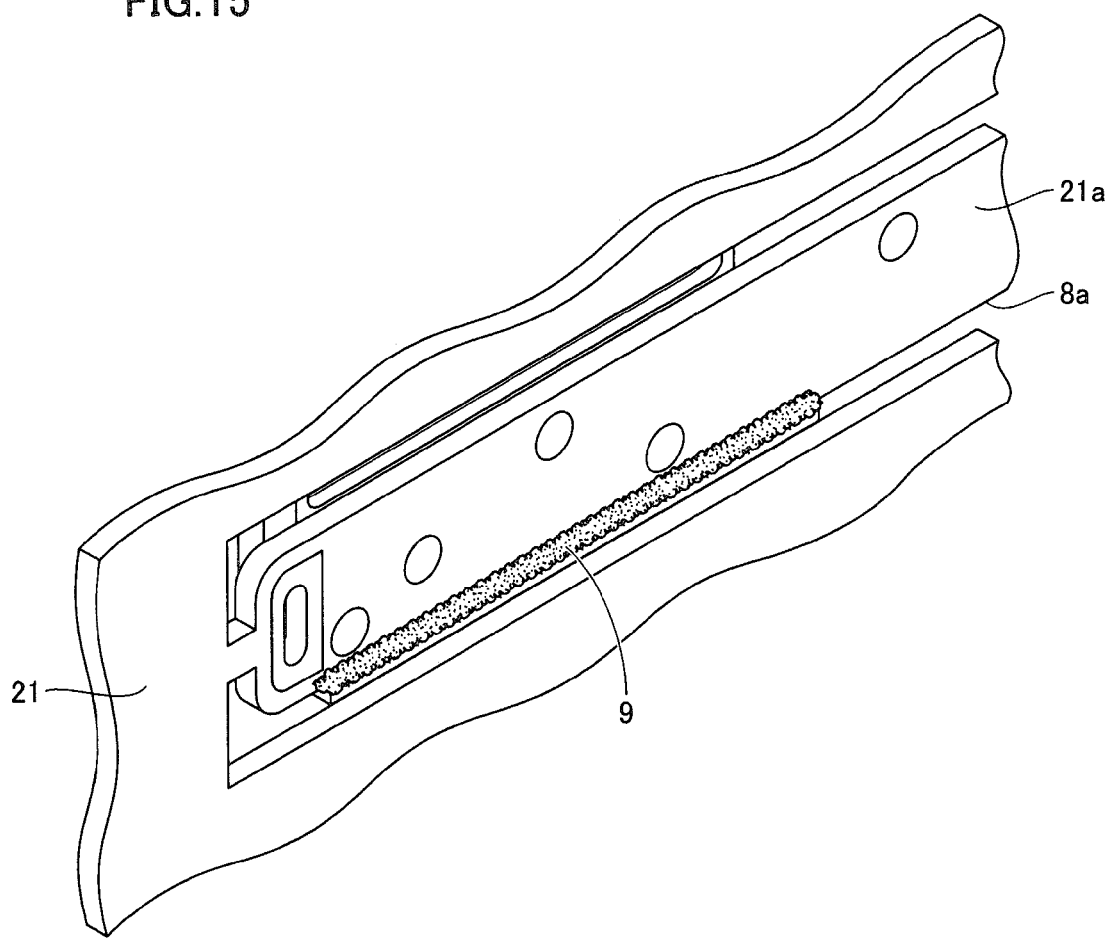
FIG. 15 is a partially enlarged perspective view showing a step performed after the step shown in FIG. 14 in the same embodiment.

Next, as shown in FIG. 14, dispenser 34 and syringe 32 are used to apply the silicon resin with the same viscosity from nozzle 33 of syringe 32 to a prescribed area in gap SV2 between board end surface facing portion 4 and end surface 8a of region 21a. The silicon resin applied in gap SV2 flows by the capillary phenomenon as indicated by arrows 53 and 54 to spread throughout gap SV2. Thereafter, as shown in FIG. 15, the silicon resin is dried at room temperature and cured, and thus gap SV2 is filled with silicon resin 9.

Figure 16:
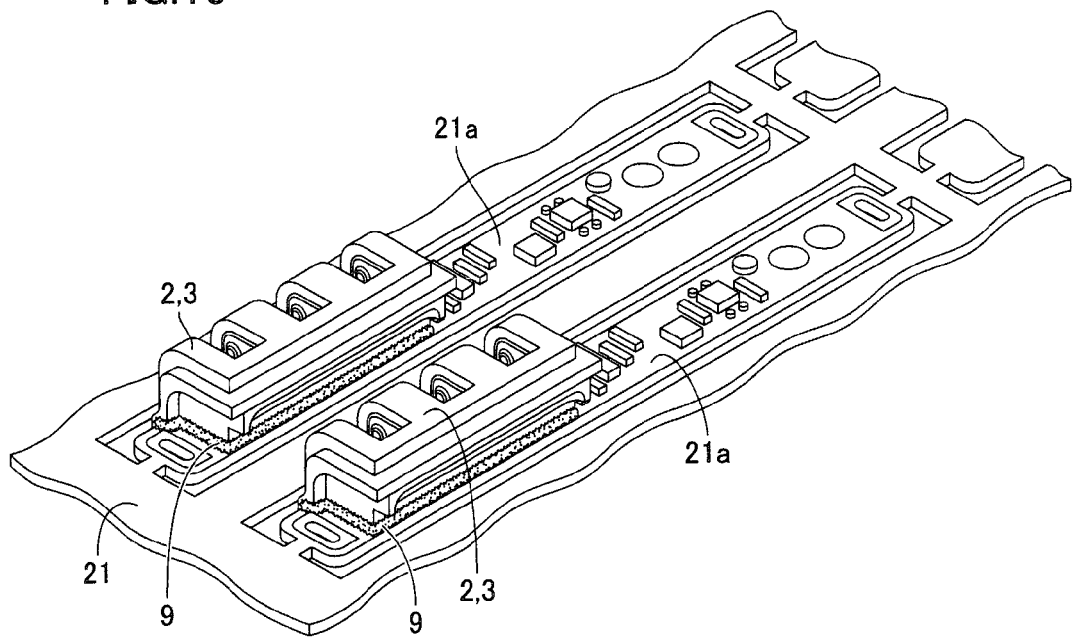
FIG. 16 is a first partial perspective view showing a step performed after the step shown in FIG. 15 in the same embodiment.
Figure 17:
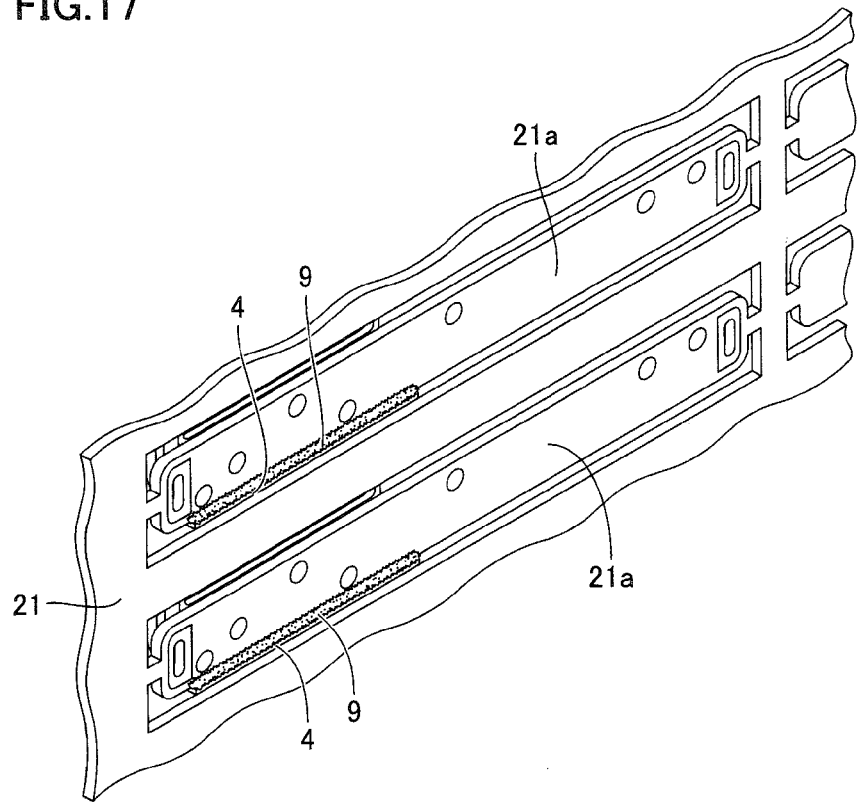
FIG. 17 is a second partial perspective view in the step shown in FIG. 16 in the same embodiment.
Figure 18:
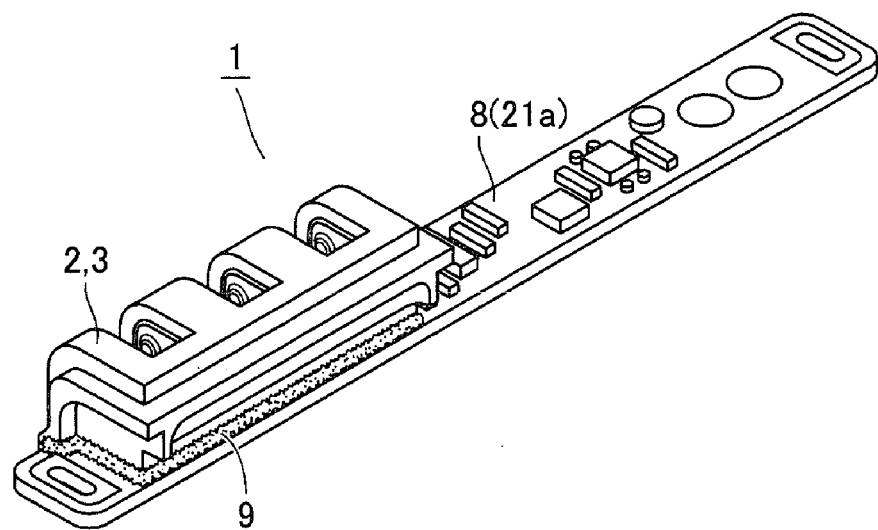
FIG. 18 is a first perspective view showing a step performed after the step shown in FIG. 16 in the same embodiment.
Figure 19:
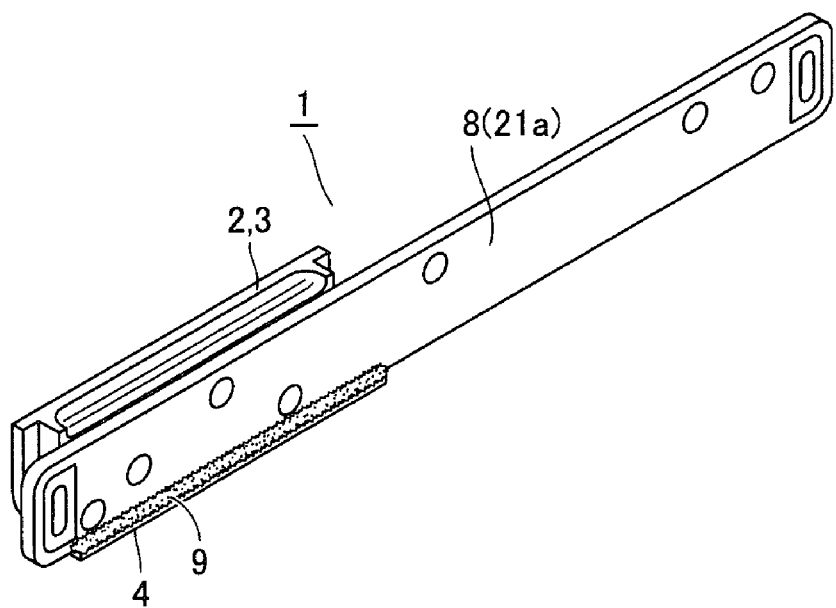
FIG. 19 is a second perspective view in the step shown in FIG. 18 in the same embodiment.

Thereby, as shown in FIGS. 16 and 17, the gap between board 21 and connector body 2 placed on board 21 is filled with silicon resin 9. Next, each region 21a, which is supposed to serve as a circuit board, is removed from board 21, and thus connector device 1 in which connector body 2 is attached to circuit board 8 is completed, as shown in FIGS. 18 and 19.

Figure 20:
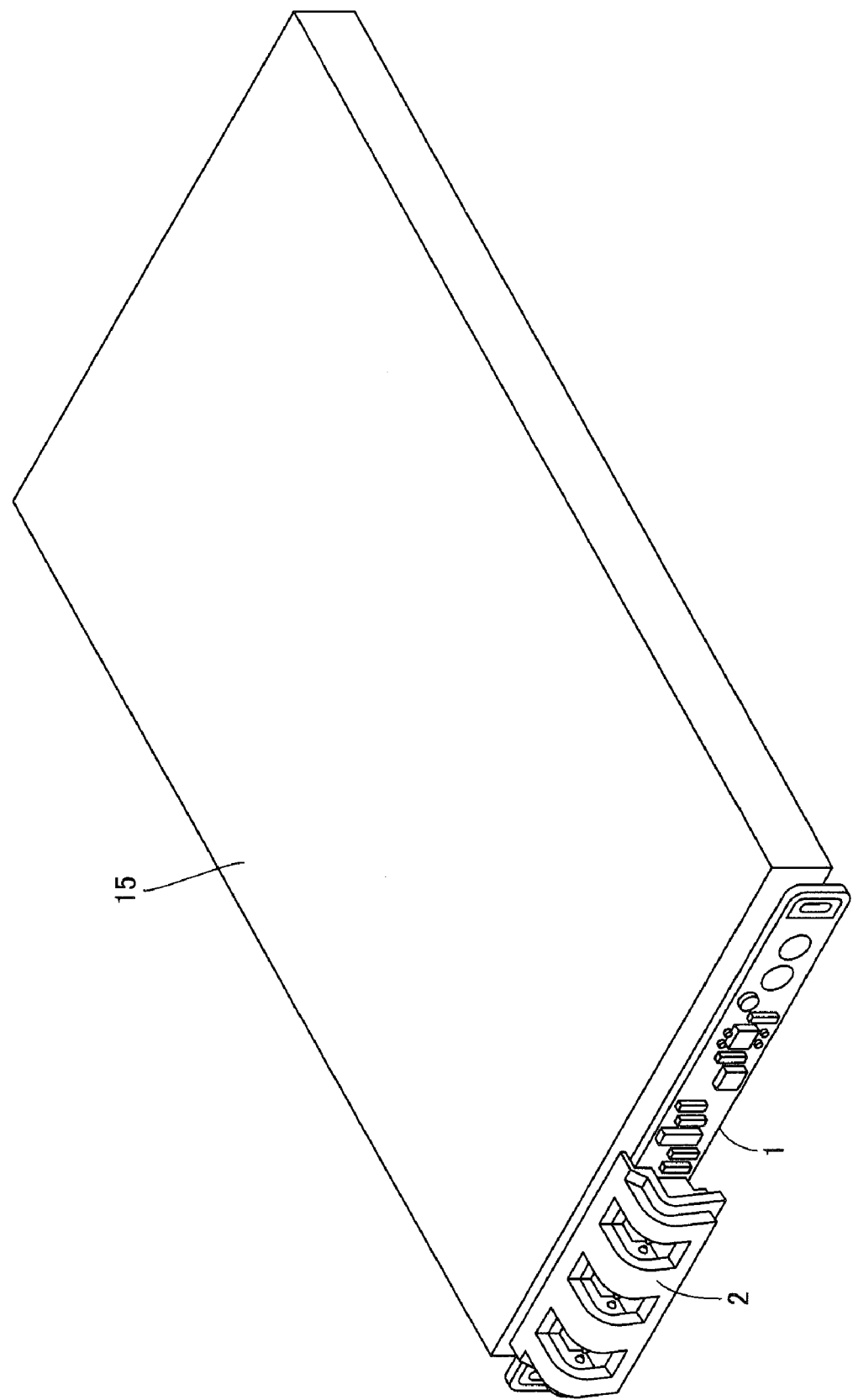
FIG. 20 is a perspective view showing a step of a method of manufacturing a battery pack using the connector device in the same embodiment.
Figure 21:
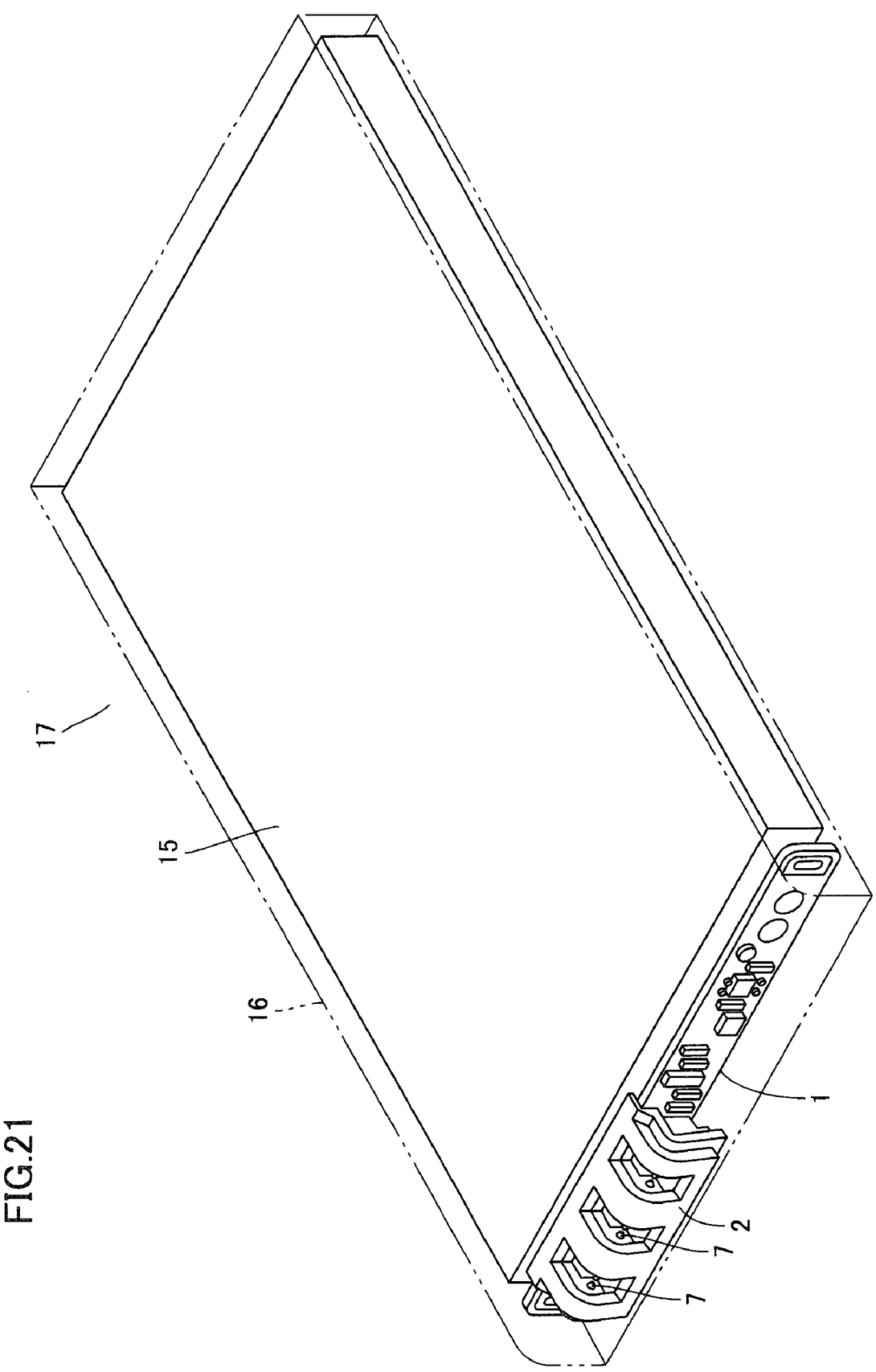
FIG. 21 is a perspective view showing a step performed after the step shown in FIG. 20 in the same embodiment.

Next, a battery pack is manufactured using the completed connector device 1. Firstly, as shown in FIG. 20, connector device 1 is provided at a prescribed position with respect to a battery pack body 15 having a battery provided therein. Connector device 1 and battery pack body 15 are placed in a prescribed die (not shown). A mold resin is injected into the die and thereby connector device 1 and battery pack body 15 are sealed with the mold resin. Thereafter, a battery pack 17 including connector device 1 and battery pack body 15 sealed with a mold resin 16 is removed from the die and completed as shown in FIG. 21. Connection terminal 7 is exposed at connector body 2 of battery pack 17.

Figure 22:
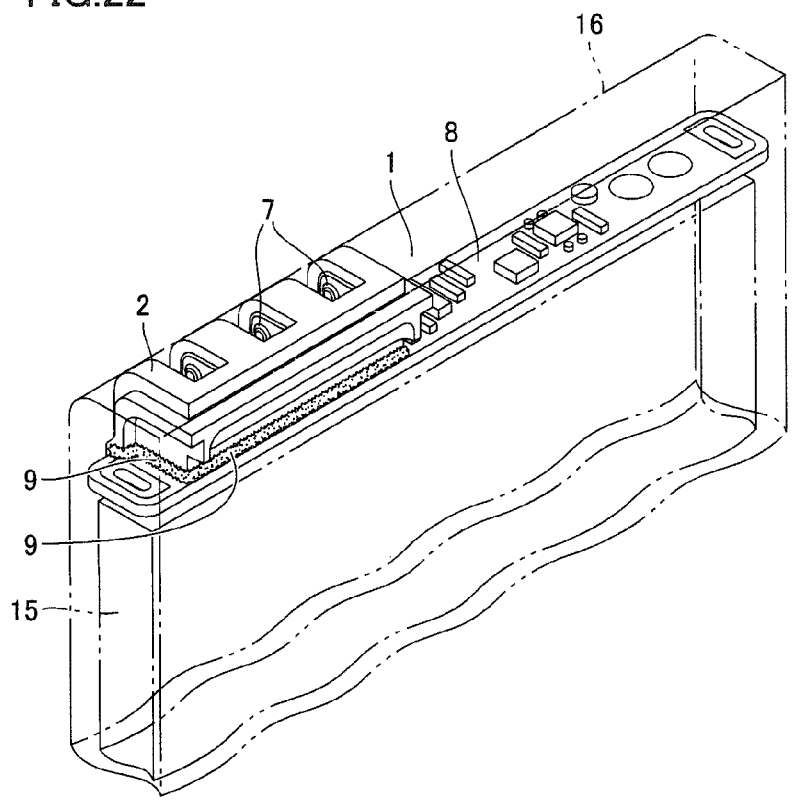
FIG. 22 is a first partially enlarged perspective view for illustrating an advantage of the connector device in manufacturing the battery pack in the same embodiment.
Figure 23:
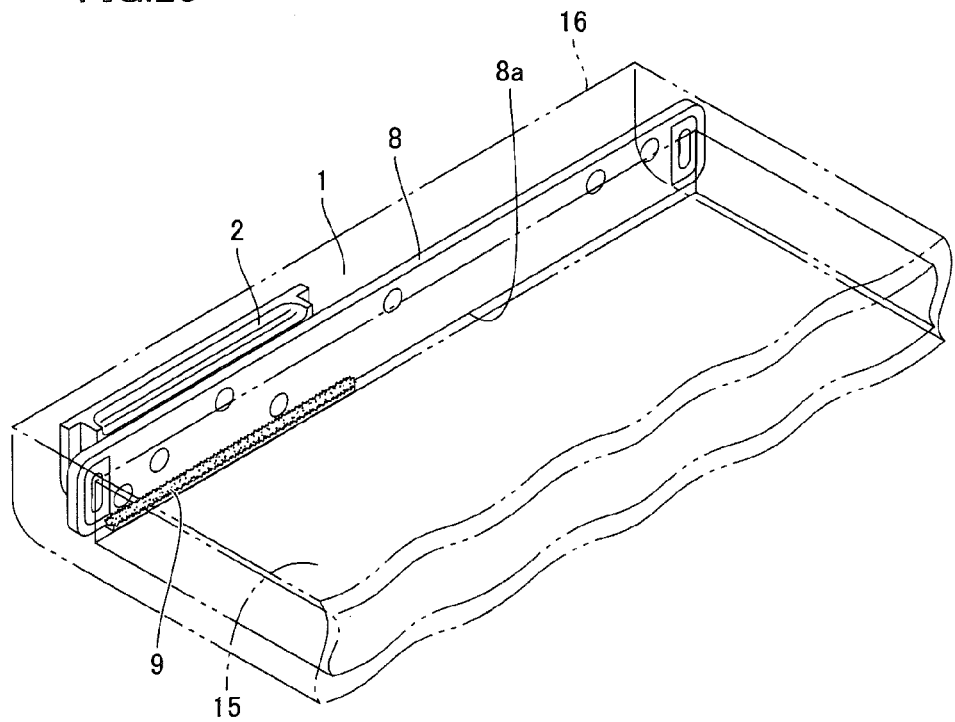
FIG. 23 is a second partially enlarged perspective view for illustrating the advantage of the connector device in manufacturing the battery pack in the same embodiment.

In connector device 1 described above, as shown in FIGS. 18 and 19, the gap between the lower end portion of housing 3 of connector body 2 and circuit board 8 and the gap between board end surface facing portion 4 and end surface 8a of circuit board 8 are filled with silicon resin 9. Thereby, when connector device 1 and battery pack body 15 are sealed with mold resin 16, mold resin 16 is prevented from entering into connector body 2 as shown in FIGS. 22 and 23. As a result, failure of conduction between connection terminal 7 provided inside connector body 2 and the mobile phone body (not shown) can be prevented.

In connector device 1 described above, the description has been given of the case where silicon resin 9 is used as a sealing member filling the gap between housing 3 of connector body 2 and circuit board 8. In order to fill the gap using the capillary phenomenon, it is desirable that the silicon resin has a viscosity of 1.4 Pa·s to 2.5 Pa·s, as described above. If the viscosity is greater than 2.5 Pa·s, it is not possible to reliably fill the gap with the resin using the capillary phenomenon, and the silicon resin is too thick relative to the size of the circuit board. If the viscosity is less than 1.4 Pa·s, the resin has a weakened adhesive force (strength) and cannot prevent entrance of the mold resin. The sealing member is not limited to the silicon resin, and other sealing members may be applied as long as they have such a viscosity.

Second Embodiment

Figure 24:
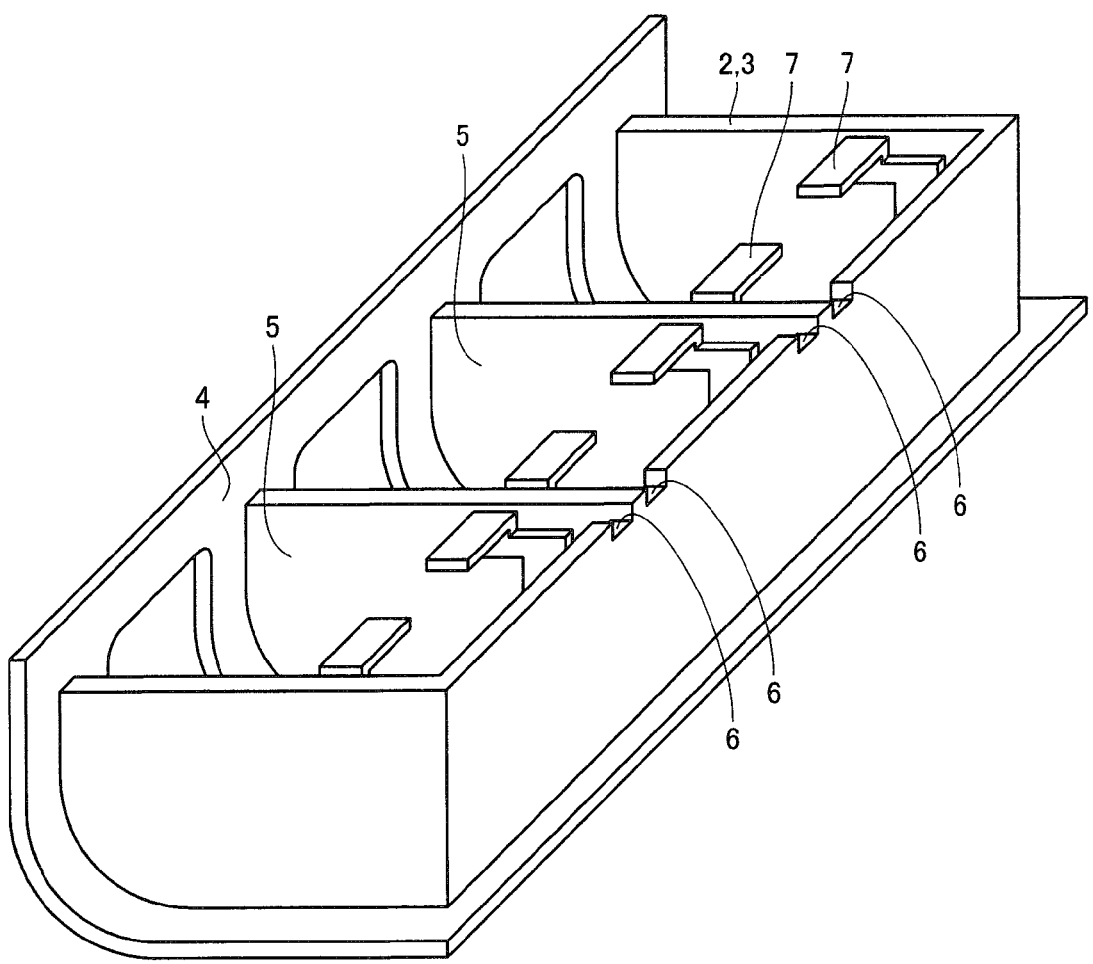
FIG. 24 is a perspective view showing a connector body of a connector device in accordance with a second embodiment of the present invention.

A connector device manufactured in less steps and a method of manufacturing the same will be described herein. As shown in FIG. 24, in connector body 2 of the connector device, a partition plate 5 provided inside housing 3 is used to introduce the applied silicon resin into the gap between board end surface facing portion 4 and the end surface of the circuit board. For that purpose, a plurality of concave portions 6 are provided at prescribed positions of housing 3.

Two partition plates 5 extend from a side on which board end surface facing portion 4 is formed to an opposite side, and have a function of each holding connection terminal 7 provided inside housing 3 and electrically insulating connection terminals 7 from each other. Two concave portions 6 are formed at a portion where each partition plate 5 is connected to an outer wall of housing 3. In the lower end portion of the outer wall of housing 3, one concave portion 6 is formed on one of two sides sandwiching partition plate 5 and the other concave portion 6 is formed on the other of the two sides sandwiching partition plate 5. Concave portion 6 may be any concave portion provided adjacent to the lower end portion of the outer wall to allow the silicon resin to be introduced to partition plate 5.

Figure 25:
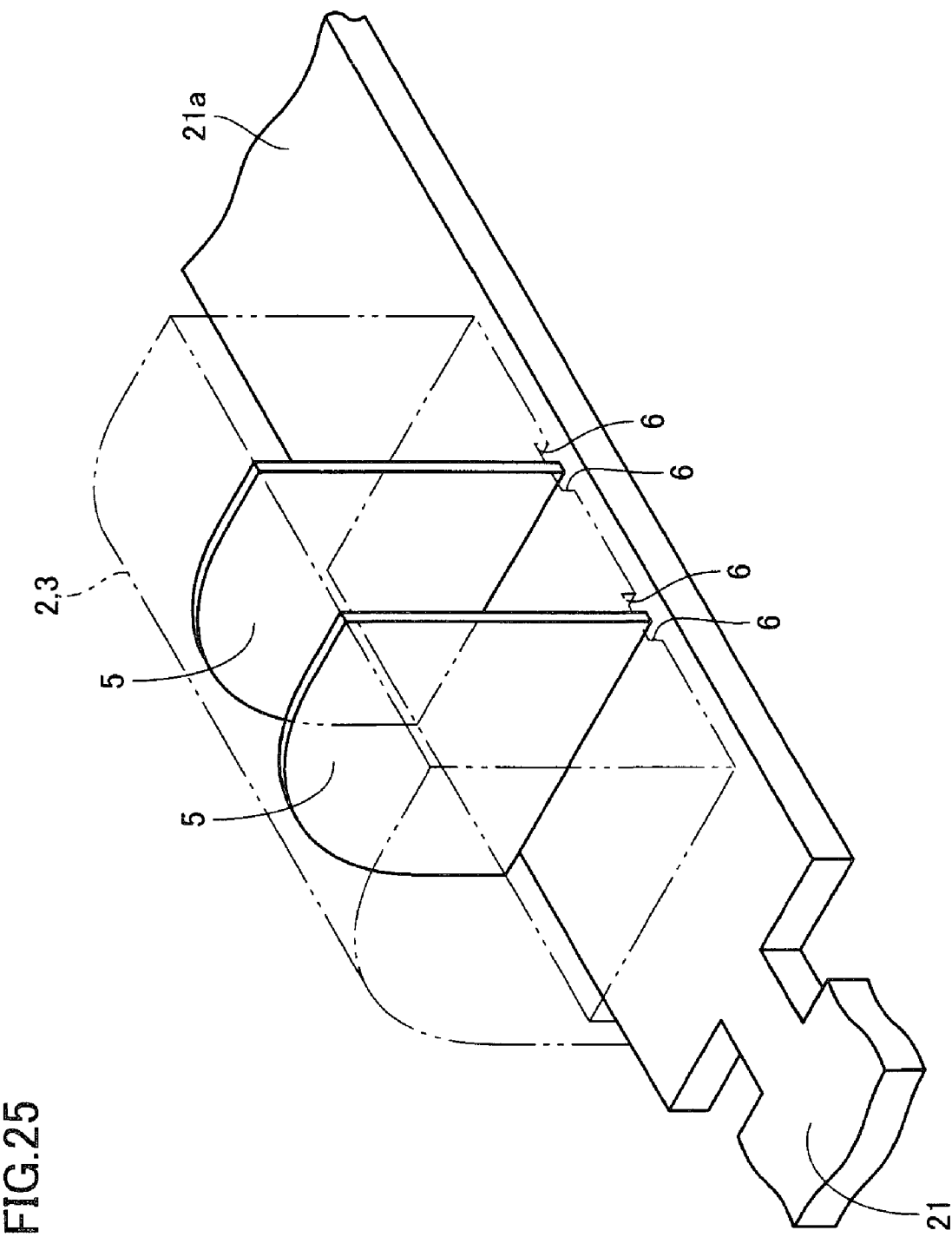
FIG. 25 is a partially enlarged perspective view showing a step of a method of manufacturing the connector device in the same embodiment.

Next, an exemplary method of manufacturing the connector device applying connector body 2 described above will be described. Firstly, as shown in FIG. 25, connector body 2 is placed at a prescribed position on region 21a of board 21 after undergoing steps similar to the aforementioned steps shown in FIGS. 3 to 6.

Figure 26:
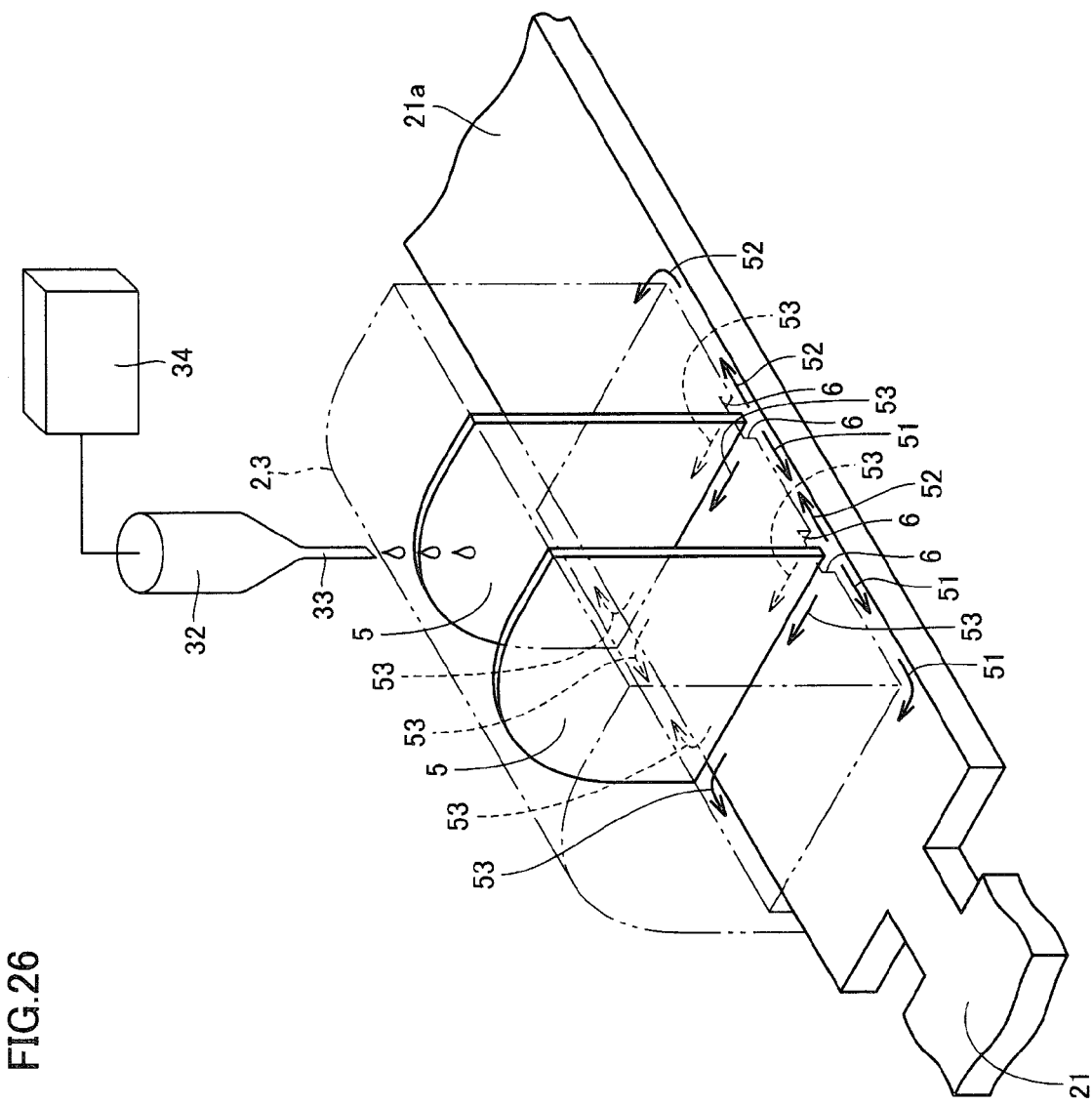
FIG. 26 is a partially enlarged perspective view showing a step performed after the step shown in FIG. 25 in the same embodiment.

Then, as shown in FIG. 26, dispenser 34 and syringe 32 are used to apply the silicon resin with a viscosity of 1.4 Pa·s to 2.5 Pa·s from nozzle 33 of syringe 32 to the portion in the lower end portion of housing 3 where concave portion 6 is formed. A portion of the applied silicon resin flows by the capillary phenomenon as indicated by arrows 51 and 52 to spread throughout the gap between the outer wall of housing 3 and region 21a. The rest of the silicon resin flows by the capillary phenomenon as indicated by arrow 53 along a gap between partition plate 5 and region 21a up to board end surface facing portion 4, and spreads throughout the gap between the board end surface facing portion and end surface 8a of region 21a.

Figure 27:
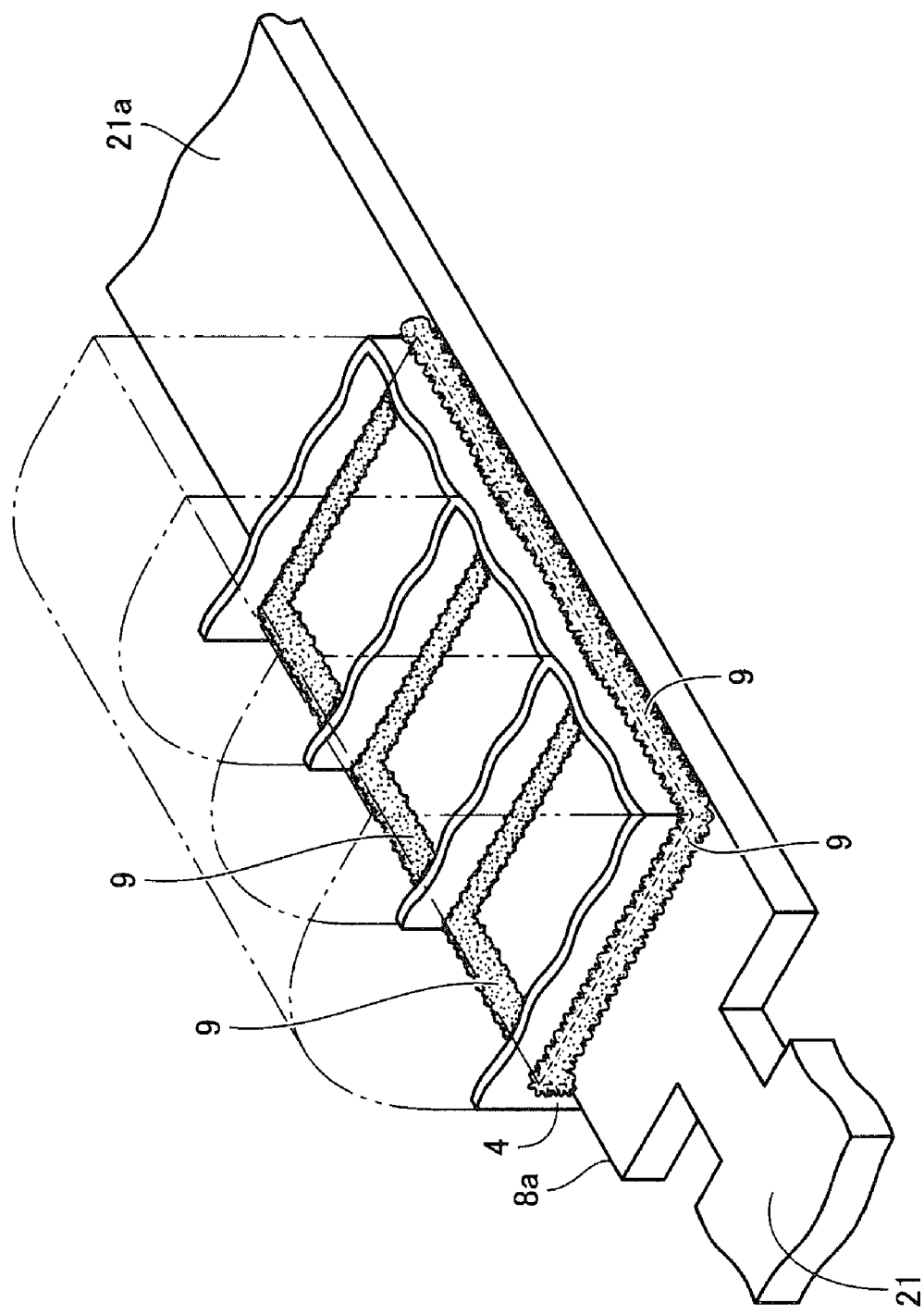
FIG. 27 is a partially enlarged perspective view showing a step performed after the step shown in FIG. 26 in the same embodiment.
Figure 28:
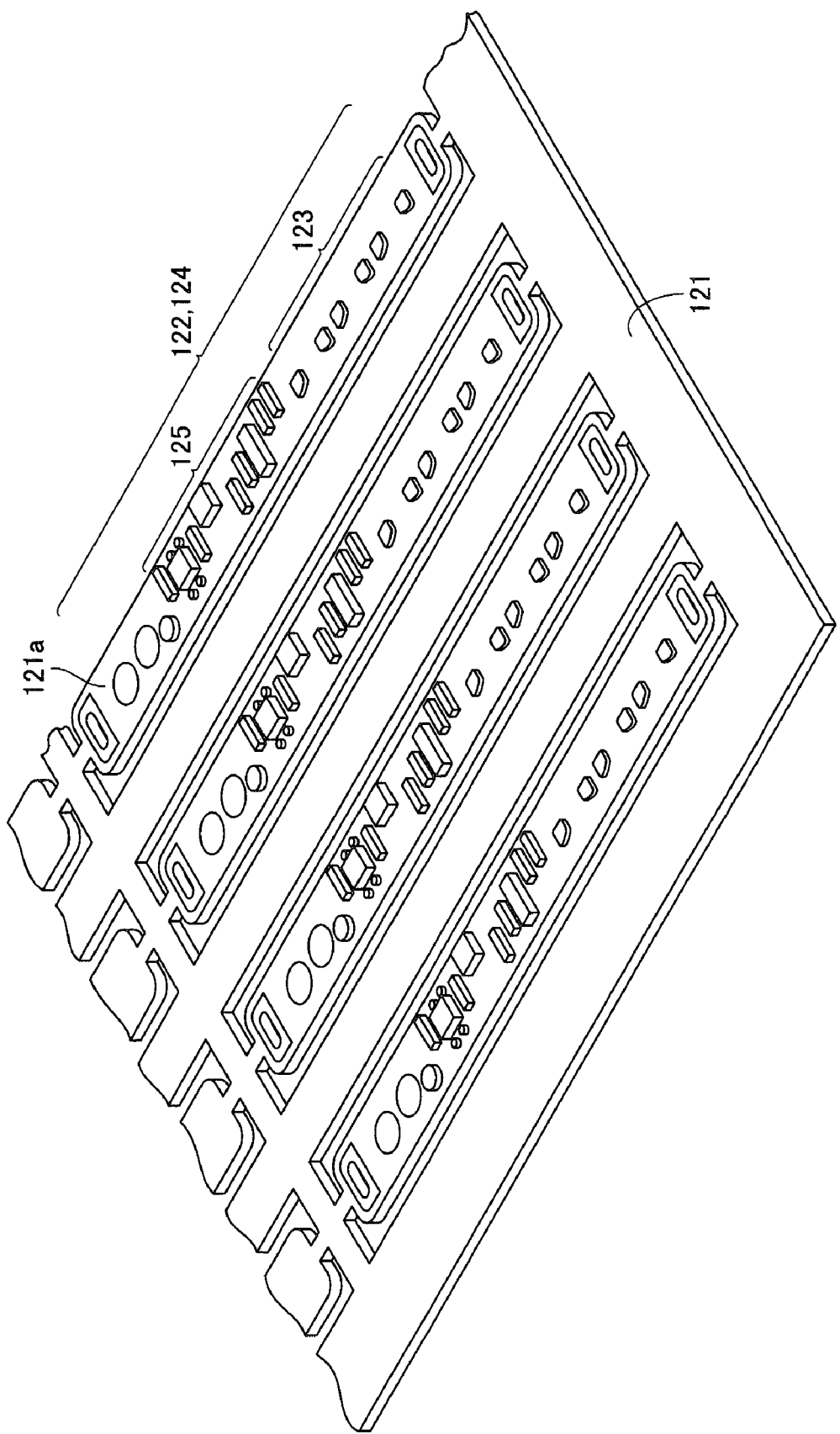
FIG. 28 is a partial perspective view showing a step of a method of manufacturing a conventional connector device.
Figure 29:
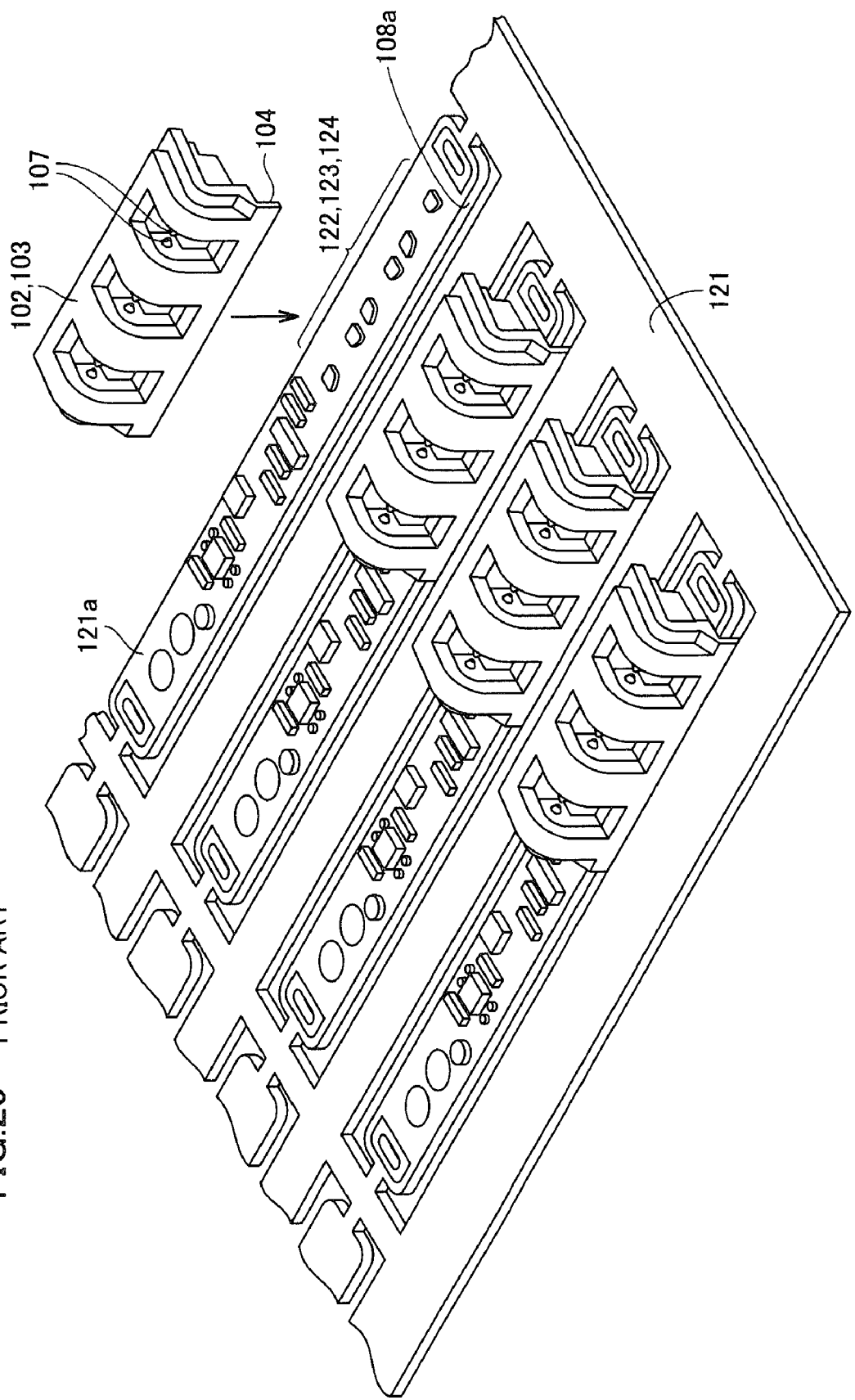
FIG. 29 is a partial perspective view showing a step performed after the step shown in FIG. 28.
Figure 30:
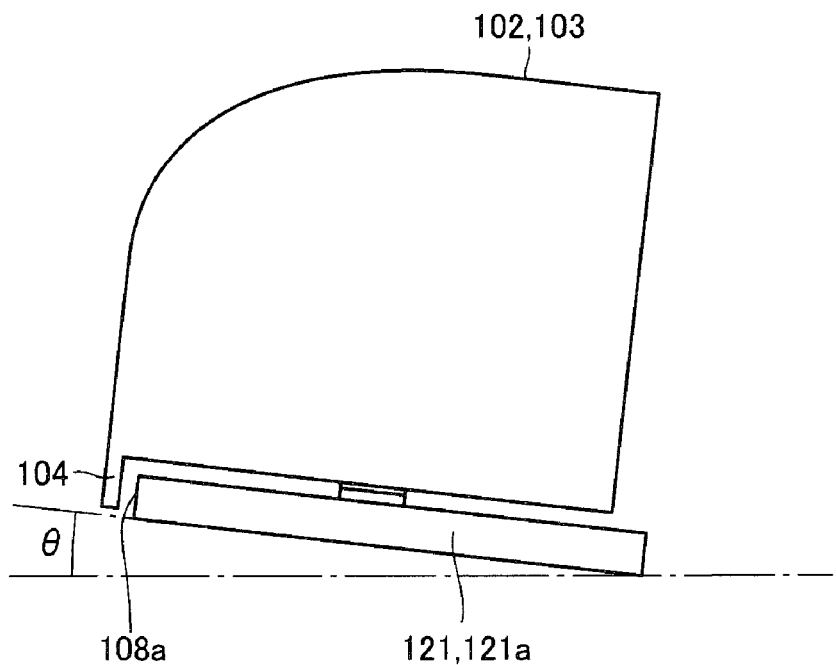
FIG. 30 is a partial side view showing a step performed after the step shown in FIG. 29.
Figure 31:
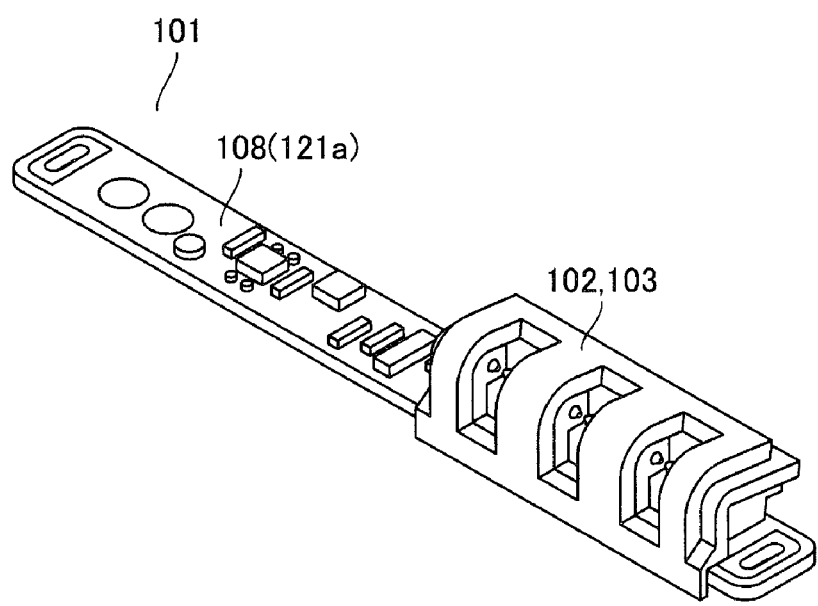
FIG. 31 is a perspective view showing a step performed after the step shown in FIG. 30.
Figure 32:
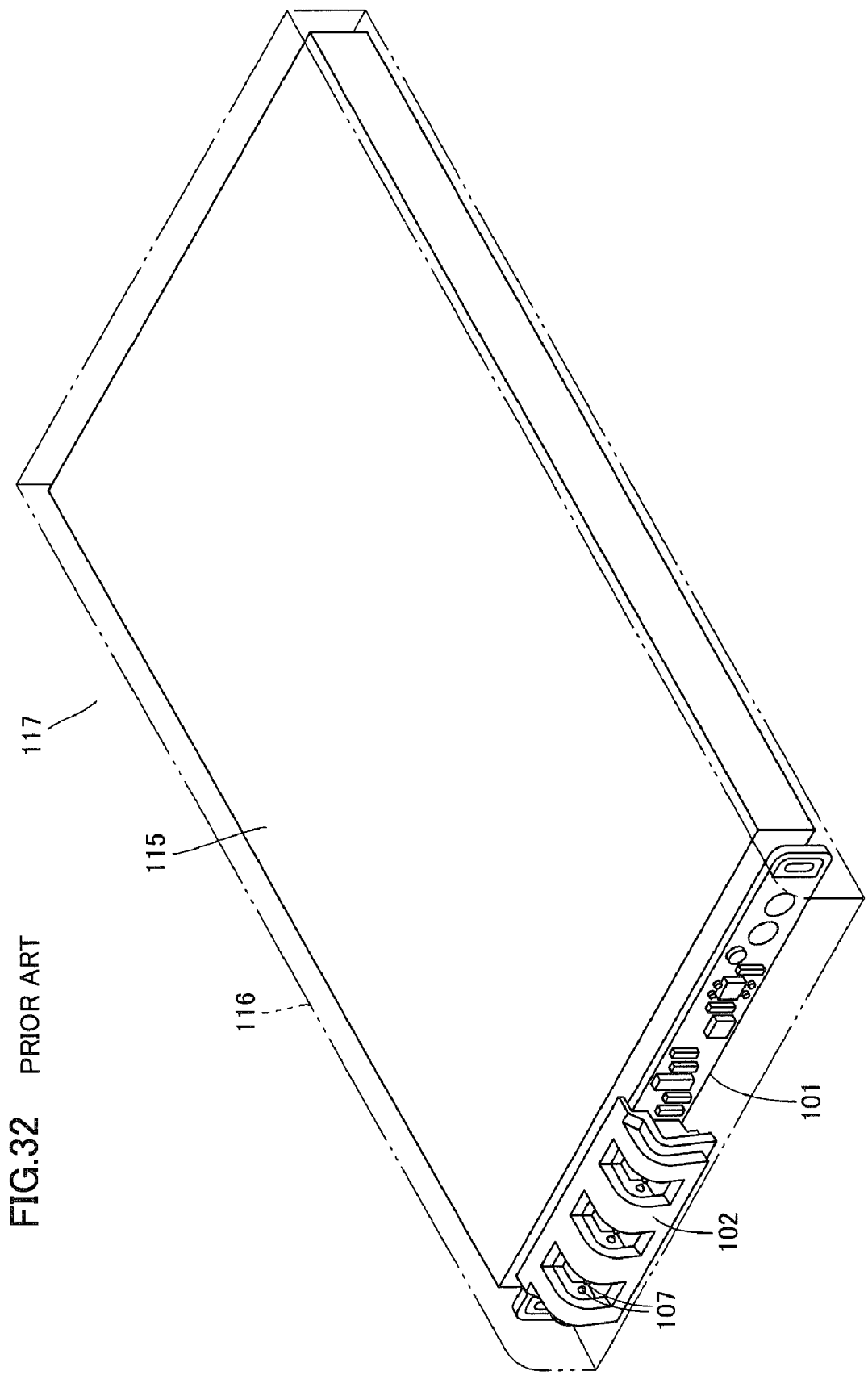
FIG. 32 is a perspective view showing a step of a method of manufacturing a battery pack using the conventional connector device.
Figure 33:
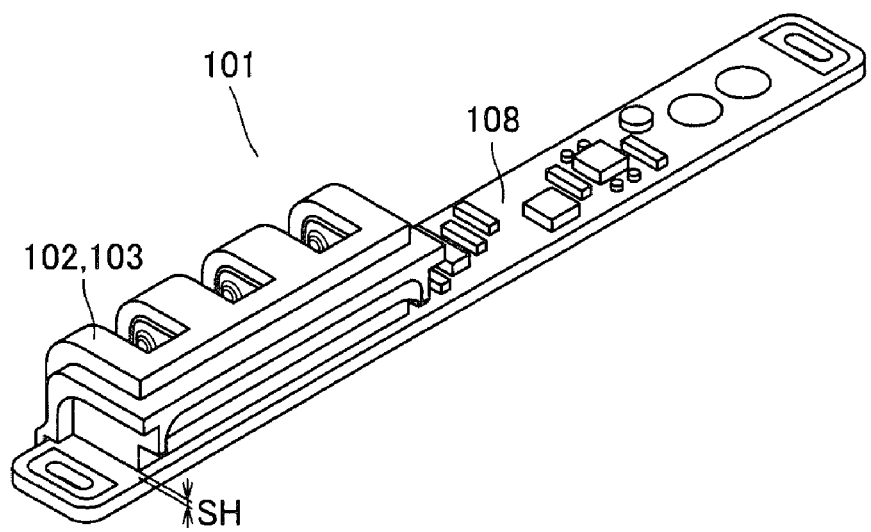
FIG. 33 is a first perspective view for illustrating a problem in the conventional connector device.
Figure 34:
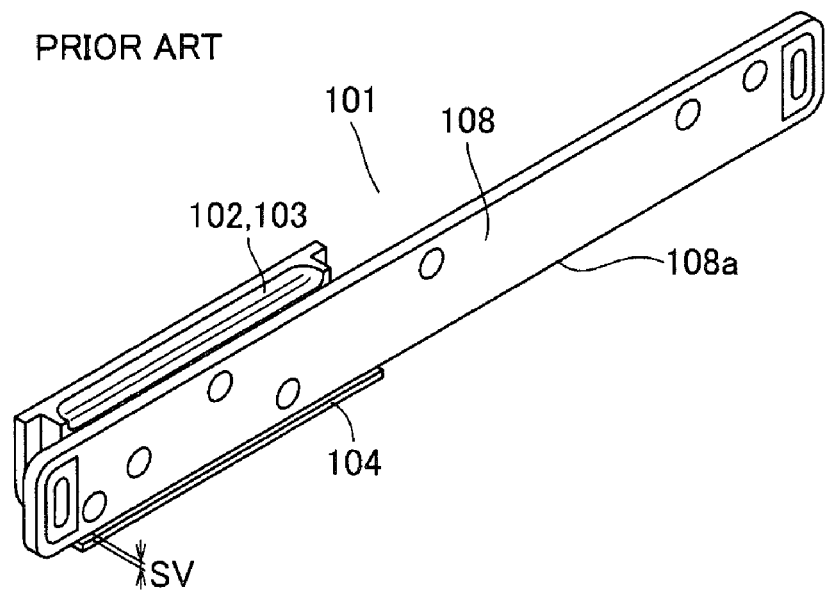
FIG. 34 is a second perspective view for illustrating the problem in the conventional connector device.
Figure 35:
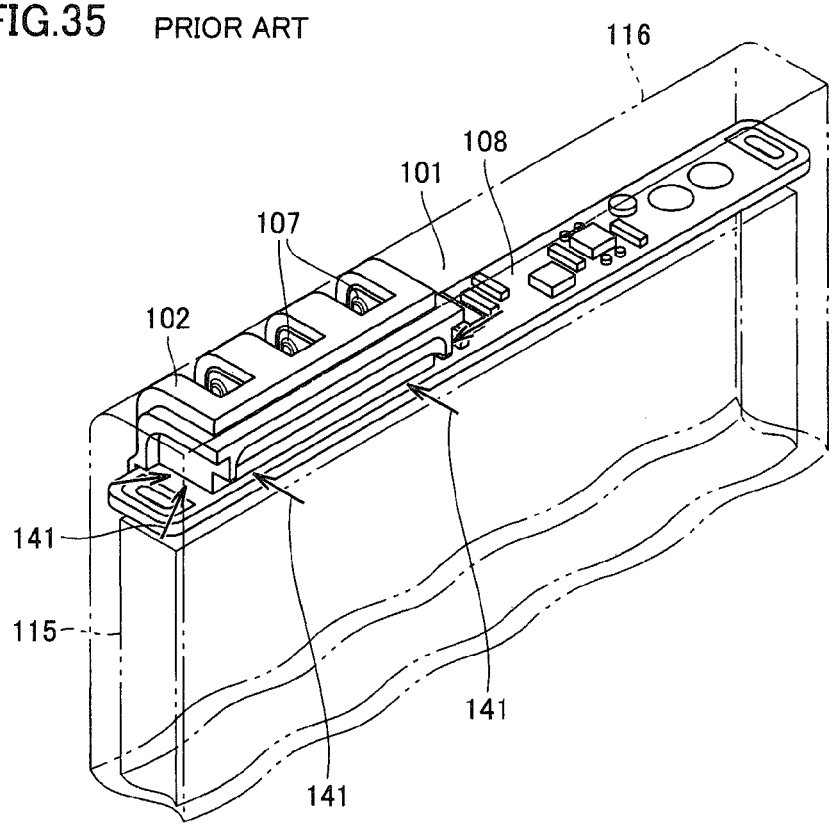
FIG. 35 is a first perspective view for illustrating a problem in the battery pack using the conventional connector device.
Figure 36:
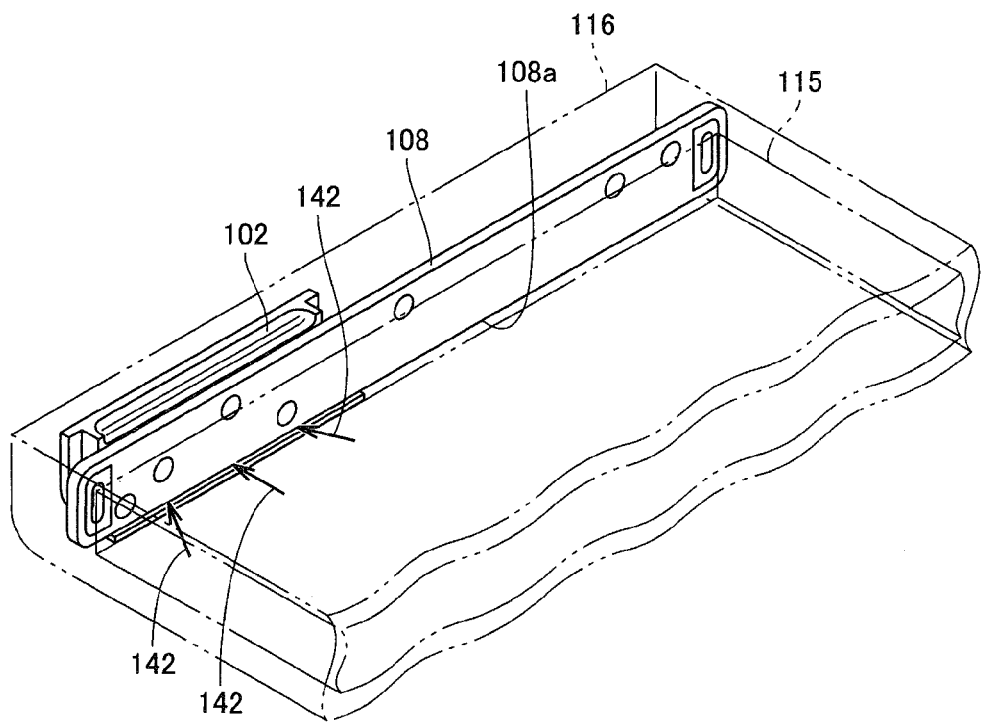
FIG. 36 is a second perspective view for illustrating the problem in the battery pack using the conventional connector device.

Next, as shown in FIG. 27, the silicon resin is dried at room temperature and thus silicon resin 9 is cured. Thereby, the gap between the lower end portion of housing 3 and region 21a is filled with silicon resin 9 and the gap between board end surface facing portion 4 and end surface 8a of region 21a is also filled with silicon resin 9, in a single application of the silicon resin.

Next, each region 21a, which is supposed to serve as a circuit board, is removed from board 21, and thus connector device 1 in which connector body 2 is attached to circuit board 8 is completed (see FIGS. 18 and 19). Thereafter, battery pack 17 including connector device 1 is completed (see FIG. 21) after undergoing steps similar to the aforementioned steps shown in FIGS. 20 and 21.

In the connector device described above, an effect as described below can be obtained in addition to the aforementioned effect of the connector device. Specifically, both the gap between the lower end portion of housing 3 and circuit board 8 (region 21a) and the gap between board end surface facing portion 4 and end surface 8a of circuit board 8 can be filled in a single application of the silicon resin, using partition plate 5 of housing 3. Thereby, when compared to the case where the silicon resin is applied in two steps to fill the gaps, one of the application steps can be eliminated, and thus the number of the steps can be reduced.

In connector device 1 described above, the description has been given of the case where partition plate 5 is used to introduce the silicon resin applied at a portion of housing 3 on a side (a second side) opposite to a side on which board end surface facing portion 4 is located (a first side) up to the side on which board end surface facing portion 4 is located. The structure for introducing the silicon resin up to board end surface facing portion 4 is not limited to partition plate 5 as described above, and any member such as a rib or a columnar member may be used as long as it can introduce the silicon resin by the capillary phenomenon through a gap between region 21a and a member provided inside housing 3 to extend from the second side to the first side.

The embodiments herein disclosed are by way of illustration and not to be taken by way of limitation. The scope of the present invention is defined not by the above description but by the appended claims, and is intended to include all the modifications within the meaning and the scope equivalent to those of the claims.

What is claimed is:

1. A connector device, comprising:
   a circuit board;
   a connector body attached to a main surface of said circuit board and having a connection terminal electrically connected to a prescribed terminal on said circuit board and a housing holding and covering said connection terminal;
   a sealing member filling a gap between said housing and said circuit board, and
   a board end surface facing portion extending along an end surface of said circuit board and facing said end surface,
   wherein said sealing member includes a portion filling a gap between said board end surface facing portion and said end surface.

2. The connector device according to claim 1, wherein said sealing member is a silicon resin.

3. The connector device according to claim 1, wherein said housing includes a sealing member introducing portion extending toward a first side of said housing on which said board end surface facing portion is formed, from a second side opposite to said first side, and introducing said sealing member from said second side toward said first side.

4. The connector device according to claim 3, wherein
   said connection terminal is provided inside said housing in a plural number,
   said housing includes a partition plate separating and holding each said connection terminal, and
   said sealing member introducing portion includes said partition plate and a concave portion provided adjacent to a lower end portion of a portion where said partition plate is connected to an outer wall of said housing on said second side.

5. The connector device according to claim 2, wherein said sealing member has a viscosity of 1.4 Pa·s to 2.5 Pa·s.

6. A method of manufacturing a connector device, comprising:
   a fixing step fixing a connector body holding a connection terminal to a prescribed position on a circuit board such that said connection terminal is connected to a prescribed terminal on said circuit board;
   an application step applying a sealing member to fill a gap between said connector body and said circuit board; and
   a step of curing said applied sealing member, wherein
   said connector body includes:
   a housing holding and covering said connection terminal; and
   a board end surface facing portion provided to said housing and facing an end surface of said circuit board with said connector body attached to said circuit board, and
   said fixing step includes the steps of:
   applying solder to said circuit board;
   placing said connector body on said circuit board;
   melting said solder by performing heat treatment with the board inclined such that said board end surface facing portion approaches the end surface of the board; and
   cooling said melted solder and fastening said connector body to said circuit board.

7. The method of manufacturing a connector device according to claim 6, wherein said sealing member is introduced into a gap between said housing and said circuit board and a gap between said board end surface facing portion and the end surface of said board by a capillary phenomenon in said application step.

8. The method of manufacturing a connector device according to claim 6, wherein said sealing member is introduced into the gap between said connector body and said circuit board by a capillary phenomenon in said application step.

9. The method of manufacturing a connector device according to claim 6, wherein
   said housing includes a sealing member introducing portion extending toward a first side of said housing on which said board end surface facing portion is formed, from a second side opposite to said first side, and introducing said sealing member from said second side toward said first side, and
   said sealing member is applied to a lower end portion of said housing on said second side and thereby introduced from said second side to said first side via said sealing member introducing portion by a capillary phenomenon in said application step.

10. A battery pack, comprising:
    a circuit board;
    a connector body attached to a main surface of said circuit board and having a connection terminal electrically connected to a prescribed terminal on said circuit board and a housing holding and covering said connection terminal;
    a sealing member filling a gap between said housing and said circuit board;
    a battery pack body provided at a prescribed position with respect to said circuit board to which said connector body is attached; and
    a mold resin sealing said connector body, said circuit board, and said battery pack body such that said connection terminal of said connector body is exposed, and
    a board end surface facing portion extending along an end surface of said circuit board and facing said end surface,
    wherein said sealing member includes a portion filling a gap between said board end surface facing portion and said end surface.

* * * * *